United States Patent
Solbach et al.

(10) Patent No.: US 10,628,346 B2
(45) Date of Patent: *Apr. 21, 2020

(54) ADAPTIVE BUFFERING OF DATA RECEIVED FROM A SENSOR

(71) Applicant: InvenSense, Inc., San Jose, CA (US)

(72) Inventors: Ludger Solbach, San Jose, CA (US); Carlo Murgia, Sunnyvale, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/190,024

(22) Filed: Nov. 13, 2018

(65) Prior Publication Data
US 2019/0102329 A1   Apr. 4, 2019

Related U.S. Application Data

(63) Continuation of application No. 15/271,000, filed on Sep. 20, 2016, now Pat. No. 10,133,690, which is a continuation-in-part of application No. 15/048,787, filed on Feb. 19, 2016, now Pat. No. 10,169,266.

(51) Int. Cl.
*G06F 13/16* (2006.01)
*G11C 19/28* (2006.01)
*G06F 3/06* (2006.01)
*G11C 21/00* (2006.01)

(52) U.S. Cl.
CPC .......... *G06F 13/1673* (2013.01); *G06F 3/061* (2013.01); *G06F 3/0656* (2013.01); *G06F 3/0683* (2013.01); *G11C 19/28* (2013.01); *G11C 21/00* (2013.01); *Y02D 10/14* (2018.01)

(58) Field of Classification Search
CPC ........ G06F 13/20; G06F 3/061; G06F 3/0656; G06F 3/0683; G06F 13/1673
See application file for complete search history.

(56) References Cited

U.S. PATENT DOCUMENTS

| | | |
|---|---|---|
| 5,926,605 A | 7/1999 | Ichimura |
| 10,133,690 B2 | 11/2018 | Solbach et al. |
| 10,169,266 B2 | 1/2019 | Solbach et al. |

(Continued)

FOREIGN PATENT DOCUMENTS

GB   2526980 A   12/2015

OTHER PUBLICATIONS

ISA/EP, International Search Report and Written Opinion for International Application # PCT/US2017/018520, pp. 1-13, dated May 17, 2017 (dated May 17, 2017).

(Continued)

*Primary Examiner* — Idriss N Alrobaye
*Assistant Examiner* — Richard B Franklin

(57) ABSTRACT

In a method of adaptive buffering in a mobile device having a host processor and a sensor processor coupled with the host processor, the sensor processor is used to buffer data received from a sensor that is operated by the sensor processor. The data is buffered by the sensor processor into a circular data buffer. Responsive to the sensor processor detecting triggering data within the received data: a first adaptive data buffering action is initiated with respect to the data received from the sensor operated by the sensor processor; a second adaptive data buffering action is initiated with respect to second data received from a second sensor of the mobile device; and a command is sent from the sensor processor to a second processor.

20 Claims, 19 Drawing Sheets

(56) References Cited

U.S. PATENT DOCUMENTS

2014/0257821 A1 9/2014 Adams et al.
2017/0242622 A1 8/2017 Solbach et al.
2017/0242806 A1 8/2017 Solbach et al.

OTHER PUBLICATIONS

Gunther, "Algorithm 938: Compressing Circular Buffers", ACM Transactions on Mathematical Software, vol. 40, No. 2, Article 17, Feb. 2014, 12 pages.

400

```
┌─────────────────────────────────────────────────────────────┐
│  USING THE SENSOR PROCESSOR TO BUFFER DATA RECEIVED FROM A  │
│ SENSOR THAT IS OPERATED BY THE SENSOR PROCESSOR, WHEREIN THE│
│  DATA IS BUFFERED BY THE SENSOR PROCESSOR INTO A CIRCULAR   │
│                        DATA BUFFER                          │
│                            410                              │
└─────────────────────────────────────────────────────────────┘
                              │
                              ▼
┌─────────────────────────────────────────────────────────────┐
│   RESPONSIVE TO THE SENSOR PROCESSOR DETECTING TRIGGERING   │
│                  DATA WITHIN THE RECEIVED DATA:             │
│                            420                              │
│                                                             │
│   ┌─────────────────────────────────────────────────────┐   │
│   │   SETTING, BY THE SENSOR PROCESSOR, A START-END     │   │
│   │       MARKER IN THE CIRCULAR DATA BUFFER            │   │
│   │                        422                          │   │
│   └─────────────────────────────────────────────────────┘   │
│                                                             │
│   ┌─────────────────────────────────────────────────────┐   │
│   │ SENDING A COMMAND FROM THE SENSOR PROCESSOR TO A    │   │
│   │                  SECOND PROCESSOR                   │   │
│   │                        424                          │   │
│   └─────────────────────────────────────────────────────┘   │
└─────────────────────────────────────────────────────────────┘
```

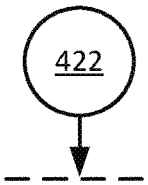

RESPONSIVE TO DETERMINING THE CIRCULAR DATA BUFFER HAS REACHED A PREDETERMINED LEVEL OF FULLNESS AFTER SETTING OF THE START-END MARKER, REPLACING DATA PREVIOUSLY BUFFERED INTO THE CIRCULAR DATA BUFFER WITH A MORE HIGHLY COMPRESSED VERSION OF THE PREVIOUSLY BUFFERED DATA
460

PASSING THE TRIGGERING DATA FROM THE SENSOR PROCESSOR TO THE SECOND PROCESSOR FOR VALIDATION BY THE SECOND PROCESSOR
470

SETTING, BY THE SENSOR PROCESSOR, AT LEAST ONE DATA MARKER FOR IDENTIFICATION OF SPECIFIC PORTIONS OF THE BUFFERED DATA
480

USING SAID SENSOR PROCESSOR TO BUFFER DATA RECEIVED FROM A SENSOR THAT IS OPERATED BY SAID SENSOR PROCESSOR, WHEREIN SAID DATA IS BUFFERED BY SAID SENSOR PROCESSOR INTO A CIRCULAR DATA BUFFER
810

RESPONSIVE TO SAID SENSOR PROCESSOR DETECTING TRIGGERING DATA WITHIN SAID RECEIVED DATA:
820

INITIATING A FIRST ADAPTIVE DATA BUFFERING ACTION WITH RESPECT TO SAID DATA RECEIVED FROM SAID SENSOR OPERATED BY SAID SENSOR PROCESSOR
822

INITIATING A SECOND ADAPTIVE DATA BUFFERING ACTION WITH RESPECT TO SECOND DATA RECEIVED FROM A SECOND SENSOR OF SAID MOBILE DEVICE
824

SENDING A COMMAND FROM SAID SENSOR PROCESSOR TO A SECOND PROCESSOR
826

RESPONSIVE TO SAID SENSOR PROCESSOR DETECTING SECOND TRIGGERING DATA, INITIATING A THIRD ADAPTIVE DATA BUFFERING ACTION WITH RESPECT TO THIRD DATA RECEIVED FROM A THIRD SENSOR
830

ADAPTIVE BUFFERING OF DATA RECEIVED FROM A SENSOR

CROSS-REFERENCE TO RELATED APPLICATIONS

This application is a continuation of and claims priority to and benefit of co-pending U.S. patent application Ser. No. 15/271,000 filed on Sep. 20, 2016, entitled "Adaptive Buffering of Data Received from a Sensor" by Ludger Solbach and Carlo Murgia, and assigned to the assignee of the present application, the disclosure of which is hereby incorporated herein by reference in its entirety.

The patent application with application Ser. No. 15/271,000 is a continuation-in-part application of and claims priority to and benefit of co-pending U.S. patent application Ser. No. 15/048,787 filed on Feb. 19, 2016 entitled "Adaptive Buffering of Data Received from a Sensor" by Ludger Solbach and Carlo Murgia, and assigned to the assignee of the present application, the disclosure of which is hereby incorporated herein by reference in its entirety.

BACKGROUND

Advances in technology have enabled the introduction of electronic devices that feature an ever increasing set of capabilities. Smartphones, for example, now offer sophisticated computing and sensing resources together with expanded communication capability, digital imaging capability, and user experience capability. Likewise, tablets, wearables, media players, Internet connected devices (which may or may not be mobile), and other similar electronic devices have shared in this progress and often offer some or all of these capabilities. Many of the capabilities of electronic devices, and in particular mobile electronic devices, are enabled by sensors (e.g., accelerometers, gyroscopes, pressure sensors, thermometers, acoustic sensors, etc.) that are included in the electronic device. That is, one or more aspects of the capabilities offered by electronic devices will rely upon information provided by one or more of the sensors of the electronic device in order to provide or enhance the capability. In general, sensors detect or measure physical or environmental properties of the device or its surroundings, such as one or more of the orientation, velocity, and acceleration of the device, and/or one or more of the temperature, acoustic environment, atmospheric pressure, etc. of the device and/or its surroundings, among others.

BRIEF DESCRIPTION OF DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers.

FIGS. 4A-4G illustrate a flow diagram of an example method of adaptive buffering in a mobile device having a host processor and a sensor processor coupled with the host processor, according to various embodiments.

FIGS. 8A and 8B illustrate a flow diagram of an example method of adaptive buffering in a mobile device having a host processor and a sensor processor coupled with the host processor, according to various embodiments.

DESCRIPTION OF EMBODIMENTS

Figure 1:
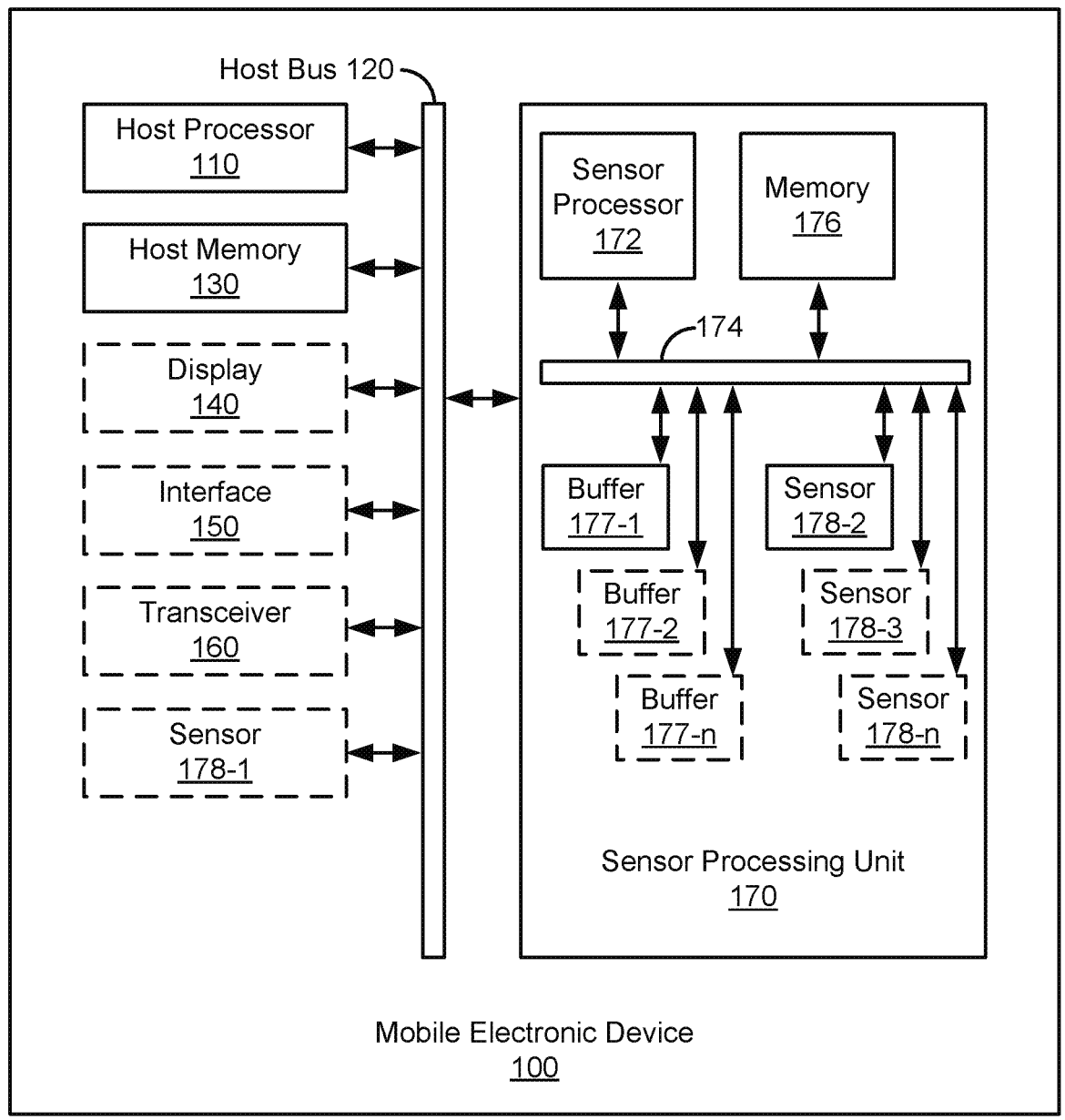
FIG. 1 is a block diagram of a mobile electronic device which includes a sensor processing unit, in accordance with various embodiments.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be one or more self-consistent procedures or instructions leading to a desired result. The procedures are those requiring physical manipulations of physical quantities. Usually, although not necessarily, these quantities take the form of electrical or magnetic signals capable of being stored, transferred, combined, compared, and otherwise manipulated in an electronic device.

It should be borne in mind, however, that all of these and similar terms are to be associated with the appropriate physical quantities and are merely convenient labels applied to these quantities. Unless specifically stated otherwise as apparent from the following discussions, it is appreciated that throughout the description of embodiments, discussions utilizing terms such as "using," "detecting," "sending," "buffering," "increasing," "replacing," "passing," "validating," "setting," and "decreasing," "using," "initiating," "combining," "storing," or the like, refer to the actions and processes of an electronic device such as: a sensor processing unit, a sensor processor, a host processor, a processor, a sensor, a memory, a mobile electronic device, or the like, or a combination thereof. The electronic device manipulates and transforms data represented as physical (electronic and/or magnetic) quantities within the electronic device's registers and memories into other data similarly represented as physical quantities within the electronic device's memories or registers or other such information storage, transmission, processing, or display components.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example mobile electronic device(s) described herein may include components other than those shown, including well-known components.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, perform one or more of the methods described herein. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors, such as one or more motion processing units (MPUs), sensor processing units (SPUs), audio processing units (APUs), host processor(s) or core(s) thereof, digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structures or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU/MPU and a microprocessor, a plurality of microprocessors, one or more microprocessors in conjunction with an SPU core, MPU core, or any other such configuration.

Overview of Discussion

Example embodiments described herein, improve the usability of electronic devices. One or more sensors and sensor processing unit(s) which operate it/them may operate to detect or measure physical or environmental properties of an electronic device (e.g., a mobile electronic device or an internet of things (IOT) device) or its surroundings while a host processor portion of the electronic device in which the sensor is disposed is in a low-power mode (e.g., a sleep mode) and/or while the host processor has off-loaded tasks to a dedicated processor. A low-power mode operates a host processor at less than its full-power mode/full-capability mode in order to conserve power use of the electronic device. One or more tasks may be off-loaded from a host processor to a dedicated processor to free up processing cycles on the host processor and/or because the dedicated processor is more efficient in energy or calculation on the off-loaded task(s). Mobile electronic devices include, but are not limited to, electronic devices such as: a cellular telephone, a media player, a tablet computer, a notebook computer, digital camera, and a wearable (e.g., a wrist wearable device like a watch, a pendant, a fitness tracker, or the like).

Any always-on feature in a mobile electronic device or an IOT electronic device has to deal with strict low-power constraints either to conserve battery power or to be energy efficient. This implies that the electronic device and any algorithms running thereon should be frugal in terms of computational resources and that higher-level functions should be relegated to the post-wakeup phase on the host processor for local operations, or else to a cloud-based processor for remote operations. Often in a device with a host processor and a sensor processor, the sensor processor uses less power and is thus kept active when the host processor is powered down or placed in a low-power mode (e.g., a sleep mode) that uses less power than a full-power mode. Various sensor processing units and schemes described herein allow for a reduction in data memory size used in the low-power, always-on module, which is often a sensor processor unit. Reducing data memory size reduces manufacturing cost, chip size, and decreases power requirements that would be associated with operating a larger data memory. This is of interest especially for high-data rate audio applications like voice wake-up or environmental acoustic sensing. When voice-wakeup, environmental acoustic sensing, or other sensing remains active while a host processor of an electronic device is in a low-power mode, there is often a need for buffering of data received from one or more sensors.

The need for buffering of received data stems from at least two constraints. The first constraint is the time it takes to wake up the host processor after triggering data (e.g., a spoken keyword) has been detected. Between the time the wake-up decision is made and the time the host processor is ready to accept the received data, new data continues to arrive that needs to be buffered in order to not get lost. The second constraint is that the host processor or some other processor may be utilized to re-process the received data that was initially processed by a sensor processor. This allows, for example, a higher-level processing function to revisit a previous analysis performed by a lower-level processing function. For example, a keyword audio signal may be originally processed by a simple speech recognition algorithm operating on a sensor processor in an electronic device and then reprocessed, for validation, by a more powerful speech recognition algorithm running on a larger processor, such as the host processor, of the electronic device.

To satisfy these constraints, a low-power, always-on algorithm can buffer a certain amount of received data from one or more sensors. For example, a sensor processing unit which operates an always-on voice wake-up algorithm may buffer several seconds of audio data and possibly data from other sensors as well. As will be described herein, the size requirement of a buffer used for buffering this data can be reduced by using a circular data buffer and by adaptively applying data compression and/or other techniques to efficiently utilize the data buffer.

Discussion is divided into two sections. In Section I, discussion begins with a description of a mobile electronic device with a sensor processing unit that includes at least one sensor. This is followed by some examples of operational descriptions of the mobile electronic device, the sensor processing unit, and one or more sensor. An example circular data buffer of the sensor processing unit is described. Numerous examples data buffering operations with the circular data buffer are described. Finally, operation of the mobile electronic device, the sensor processing unit, and the circular data buffer, is then further described in conjunction with description of example method(s) of adaptive buffering in a mobile device having a host processor and a sensor processor coupled with the host processor. In Section II, discussion begins with several description of some additional circular data buffers. Operation of the previously described mobile electronic device is described in conjunction with additional example techniques and method(s) of adaptive buffering in examples of the mobile device with concentration on taking two or more adaptive buffering actions, which can include taking adaptive buffering actions with respect to data received from two or more sensors.

SECTION I

Example Mobile Electronic Device

Turning now to the figures, FIG. 1 is a block diagram of an example mobile electronic device 100. As will be appreciated, mobile electronic device 100 may be implemented as a device or apparatus, such as a handheld mobile electronic device, that can be moved in space by a human user. That is, mobile electronic device 100 is small enough to be held in the hand of a human user, in various embodiments. For example, such a mobile electronic device may be, without limitation, a mobile telephone phone (e.g., smartphone, cellular phone, a cordless phone running on a local network, or any other cordless telephone handset), a wired telephone (e.g., a phone attached by a wire), a personal digital assistant (PDA), a video game player, video game controller, a navigation device, an activity or fitness tracker device (e.g., bracelet, clip, band, or pendant), a smart watch or other wearable device, a mobile internet device (MID), a personal navigation device (PND), a digital still camera, a digital video camera, a portable music player, a portable video player, a portable multi-media player, a remote control, a mobile IOT device, or a combination of one or more of these devices. The exact configuration of the device may depend on the type of device and its intended functions. Therefore, the block diagram of FIG. 1 is merely an example, and the different blocks may be otherwise distributed over host and sensor processing unit 170, for example all blocks may be integrated into a standalone sensor processing unit.

As depicted in FIG. 1, mobile electronic device 100 may include a host processor 110, a host bus 120, a host memory 130, and a sensor processing unit 170. Some embodiments of mobile electronic device 100 may further include one or more of a display 140, an interface 150, a transceiver 160 (all depicted in dashed lines), a sensor 178 (e.g., 178-1 and/or others which could be included but have not been depicted), and/or other components. In various embodiments, electrical power for mobile electronic device 100 is provided by a mobile power source such as a battery, when not being actively charged.

Host processor 110 can be one or more microprocessors, central processing units (CPUs), DSPs, general purpose microprocessors, ASICs, ASIPs, FPGAs or other processors which run software programs or applications, which may be stored in host memory 130, associated with the functions and capabilities of mobile electronic device 100.

Host bus 120 may be any suitable bus or interface to include, without limitation, a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. In the embodiment shown, host processor 110, host memory 130, display 140, interface 150, transceiver 160, sensor processing unit 170, and other components of mobile electronic device 100 may be coupled communicatively through host bus 120 in order to exchange commands and data. Depending on the architecture, different bus configurations may be employed as desired. For example, additional buses may be used to couple the various components of mobile electronic device 100, such as by using a dedicated bus between host processor 110 and memory 130.

Host memory 130 can be any suitable type of memory, including but not limited to electronic memory (e.g., read only memory (ROM), random access memory, or other electronic memory), hard disk, optical disk, or some combination thereof. Multiple layers of software can be stored in host memory 130 for use with/operation upon host processor 110. For example, an operating system layer can be provided for mobile electronic device 100 to control and manage system resources in real time, enable functions of application software and other layers, and interface application programs with other software and functions of mobile electronic device 100. Similarly, a user experience system layer may operate upon or be facilitated by the operating system. The user experience system may comprise one or more software application programs such as menu navigation software, games, device function control, gesture recognition, image processing or adjusting, voice recognition, navigation software, communications software (such as telephony or wireless local area network (WLAN) software), and/or any of a wide variety of other software and functional interfaces for interaction with the user can be provided. In some embodiments, multiple different applications can be provided on a single mobile electronic device 100, and in some of those embodiments, multiple applications can run simultaneously as part of the user experience system. In some embodiments, the user experience system, operating system, and/or the host processor 110 may operate in a low-power mode (e.g., a sleep mode) where very few instructions are processed. Such a low-power mode may utilize only a small fraction of the processing power of a full-power mode (e.g., an awake mode) of the host processor 110.

Display 140, when included, may be a liquid crystal device, (organic) light emitting diode device, or other display device suitable for creating and visibly depicting graphic images and/or alphanumeric characters recognizable to a user. Display 140 may be configured to output images viewable by the user and may additionally or alternatively function as a viewfinder for camera.

Interface 150, when included, can be any of a variety of different devices providing input and/or output to a user, such as audio speakers, touch screen, real or virtual buttons, joystick, slider, knob, printer, scanner, computer network I/O device, other connected peripherals and the like.

Transceiver 160, when included, may be one or more of a wired or wireless transceiver which facilitates receipt of data at mobile electronic device 100 from an external transmission source and transmission of data from mobile electronic device 100 to an external recipient. By way of example, and not of limitation, in various embodiments, transceiver 160 comprises one or more of: a cellular transceiver, a wireless local area network transceiver (e.g., a transceiver compliant with one or more Institute of Electrical and Electronics Engineers (IEEE) 802.11 specifications for wireless local area network communication), a wireless personal area network transceiver (e.g., a transceiver compliant with one or more IEEE 802.15 specifications for wireless personal area network communication), and a wired a serial transceiver (e.g., a universal serial bus for wired communication).

Sensor 178-1, when included, may comprise, without limitation: a temperature sensor, an atmospheric pressure sensor, an infrared sensor, an ultrasonic sensor, a radio frequency sensor, a navigation satellite system sensor (such as a global positioning system receiver), an acoustic sensor (e.g., a microphone), an image sensor, an inertial or motion sensor (e.g., a gyroscope, accelerometer, or magnetometer) for measuring the orientation or motion of the sensor in space, or other type of sensor for measuring other physical or environmental quantities. Sensor 178-1 is coupled with host bus 120 for communication with host processor 110, host memory 130, and sensor processing unit 170. Although depicted as being included with/native to mobile electronic device 100, sensor 178-1 may be located external to mobile electronic device 100 and communicate with mobile electronic device 100 via a wired or wireless coupling. Although only one external sensor 178-1 is depicted, a plurality of such sensor may be located internal to mobile electronic device 100, be externally located and communicatively coupled with mobile electronic device 100, or both.

Mobile electronic device 100 also includes a general purpose sensor assembly in the form of integrated sensor processing unit (SPU) 170 which includes sensor processor 172, memory 176, at least one sensor 178 (178-2, 178-3, . . . 178-n), at least one buffer 177 (177-1, 177-2, . . . 177-n), and a bus 174 for facilitating communication between these and other components of sensor processing unit 170. In some embodiments, some or all of the components illustrated in sensor processing unit 170 may be embodied on a single integrated circuit. It should be appreciated that sensor processing unit 170 may be manufactured as a stand-alone unit (e.g., an integrated circuit), that may exist separately from a larger electronic device. Although depicted as a portion of mobile electronic device 100, in some embodiments, sensor processing unit 170 may be incorporated in an electronic device that is not mobile; one non-limiting example uses sensor processing unit 170 in a voice recognition component of an Internet connected "smart" refrigerator.

Sensor processor 172 can be one or more microprocessors, CPUs, DSPs, general purpose microprocessors, ASICs, ASIPs, FPGAs or other processors which run software programs, which may be stored in memory 176, associated with the functions of sensor processing unit 170.

Bus 174 may be any suitable bus or interface to include, without limitation, a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. Depending on the architecture, different bus configurations may be employed as desired. In the embodiment shown, sensor processor 172, memory 176, buffer 177, sensor 178, and other components of sensor processing unit 170 may be communicatively coupled through bus 174 in order to exchange data.

Memory 176 can be any suitable type of memory, including but not limited to electronic memory (e.g., read only memory (ROM), random access memory, or other electronic memory). Memory 176 may store algorithms or routines or other instructions for processing data received from one or more sensors 178, as well as the received data either in its raw form or after some processing. Such algorithms and routines may be implemented by sensor processor 172 and/or by logic or processing capabilities included in sensor 178.

Buffer 177 is a data buffer that temporarily stores data received from one or more sensors 178. Data buffer 177 may store the received data in its raw form, or in a processed form after the raw data has been processed in some fashion. In some embodiments, buffer 177 may be a circular buffer. Buffer 177 may be operated to buffer the received data when host processor 110 is in a low-power mode. Additionally, buffer 177 may be operated to store the received data when one or more of sensor processor and memory 176 are operated in a low-power mode. Although depicted as an independent entity, in some embodiments, one or more buffers 177 may be a portion or subset of memory 176. In embodiments which include a plurality of buffers 177, two or more of the buffers may be implemented in the same memory or may be implemented in physically separate memories. In some embodiments, for example, buffer 177-1 may be implemented in a first distinct memory, buffer 177-2 may be implemented as a second distinct memory that is separate from the first distinct memory in which buffer 177-1 is implemented, and buffer 177-n may be implemented in a third distinct memory that is physically separate from the memories in which buffers 177-1 and 177-2 are implemented. In some embodiments, for example, buffers 177-1, and 177-2 may be implemented in a first distinct memory, while buffer 177-n is implemented in a second distinct memory that is physically separate from the memory in which buffers 177-1 and 177-2 are implemented.

A sensor 178 may comprise, without limitation: a temperature sensor, an atmospheric pressure sensor, an infrared sensor, an ultrasonic sensor, a radio frequency sensor, a navigation satellite system sensor (such as a global positioning system receiver), an acoustic sensor (e.g., a microphone), an image sensor, an inertial or motion sensor (e.g., a gyroscope, accelerometer, or magnetometer) for measuring the orientation or motion of the sensor in space, or other type of sensor for measuring other physical or environmental quantities. In one example, sensor 178-2 may comprise an acoustic sensor, sensor 178-3 may comprise a second acoustic sensor, and sensor 178-n may comprise an internal motion sensor. In other embodiments, one or more of sensors 178-2, 178-3, and 178-n may be some other type of sensor. For example, in some embodiments sensors 178-2 and 178-3 may be acoustic sensors while sensor and 178-n is a motion sensor.

In some embodiments, the mobile electronic device 100 may contain more than one sensor processing unit 170. The different sensor processing units 170 may communicate which each other or with the host over host bus 120. The different sensor processing units 170 may contain different sensors, or may contain identical sensors.

In some embodiments, one or more sensors 178 may be implemented using a micro-electro-mechanical system (MEMS) that is integrated with sensor processor 172 and one or more other components of SPU 170 in a single chip or package.

Although depicted as being included within sensor processing unit 170, one, some, or all sensors 178 may be disposed externally to sensor processing unit 170 in various embodiments. The sensors may be referred to as external sensors and may be connected to host bus 120 to communicate with e.g., host processor 110 or sensor processing unit 170.

Figure 2:
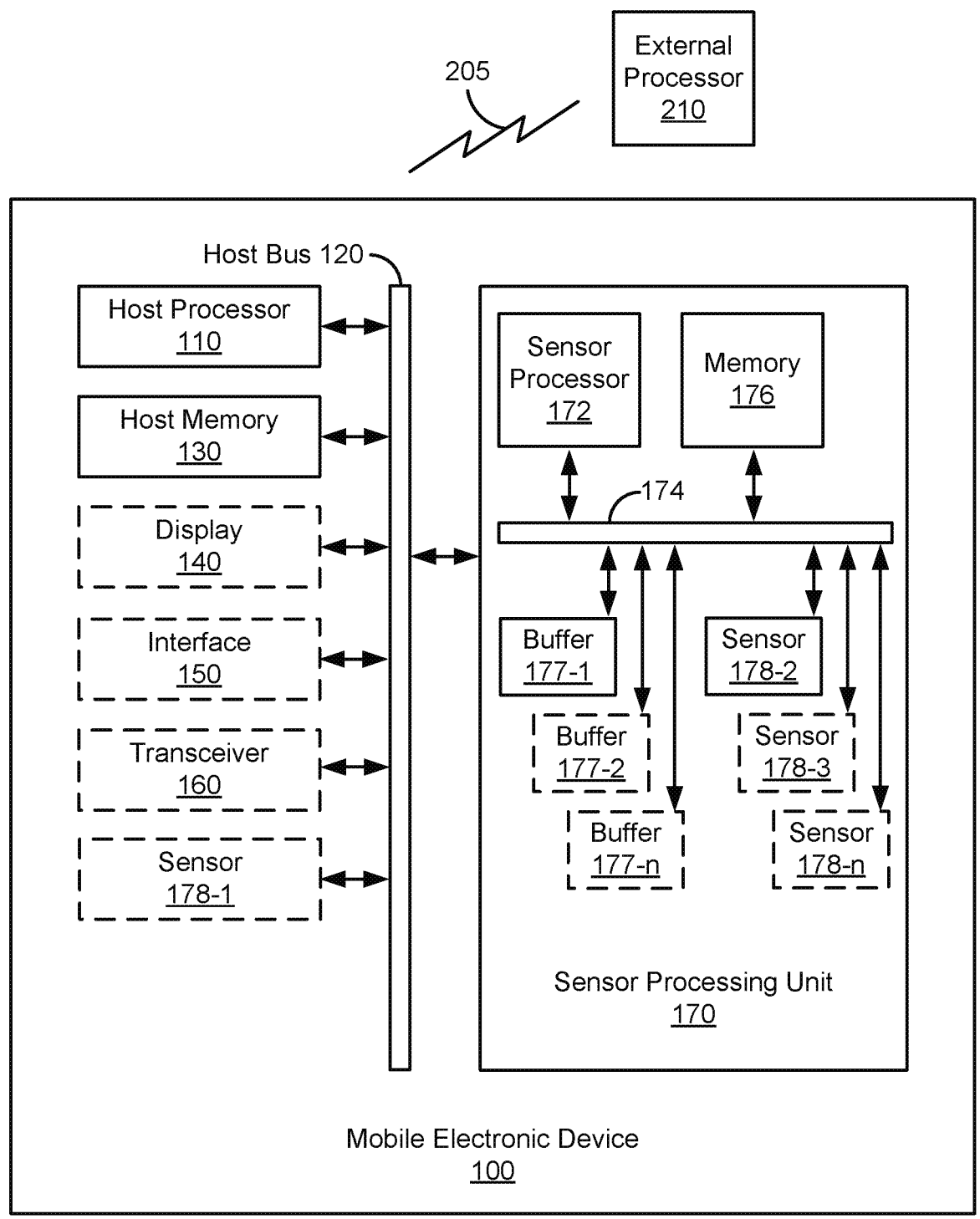
FIG. 2 is a block diagram illustrating a communicative coupling between the mobile electronic device of FIG. 1 and an external processor that is external to the mobile electronic device, in accordance with various embodiments.

FIG. 2 is a block diagram illustrating a wireless communicative coupling 205 between the mobile electronic device 100 of FIG. 1 and an external processor 210 that is external to the mobile electronic device 100, in accordance with various embodiments. The communication over wireless communicative coupling 205 may be a request, command, or instruction, a transmission of data received from a sensor 178, some other communication, or some combination of these and/or other communications. In some embodiments, as will be further described, the communication may be sent from sensor processing unit 170, such as via transceiver 160. In some embodiments, when host processor 110 is in a low-power mode, such communication may not involve host processor 110.

Example Sensor Processing Unit Operation

FIGS. 3A-3G illustrate block diagrams of an example circular data buffer 177 (i.e., 177-1) and various aspects of adaptive buffering of data received from a sensor 178, according to one or more embodiments.

Figure 3A:
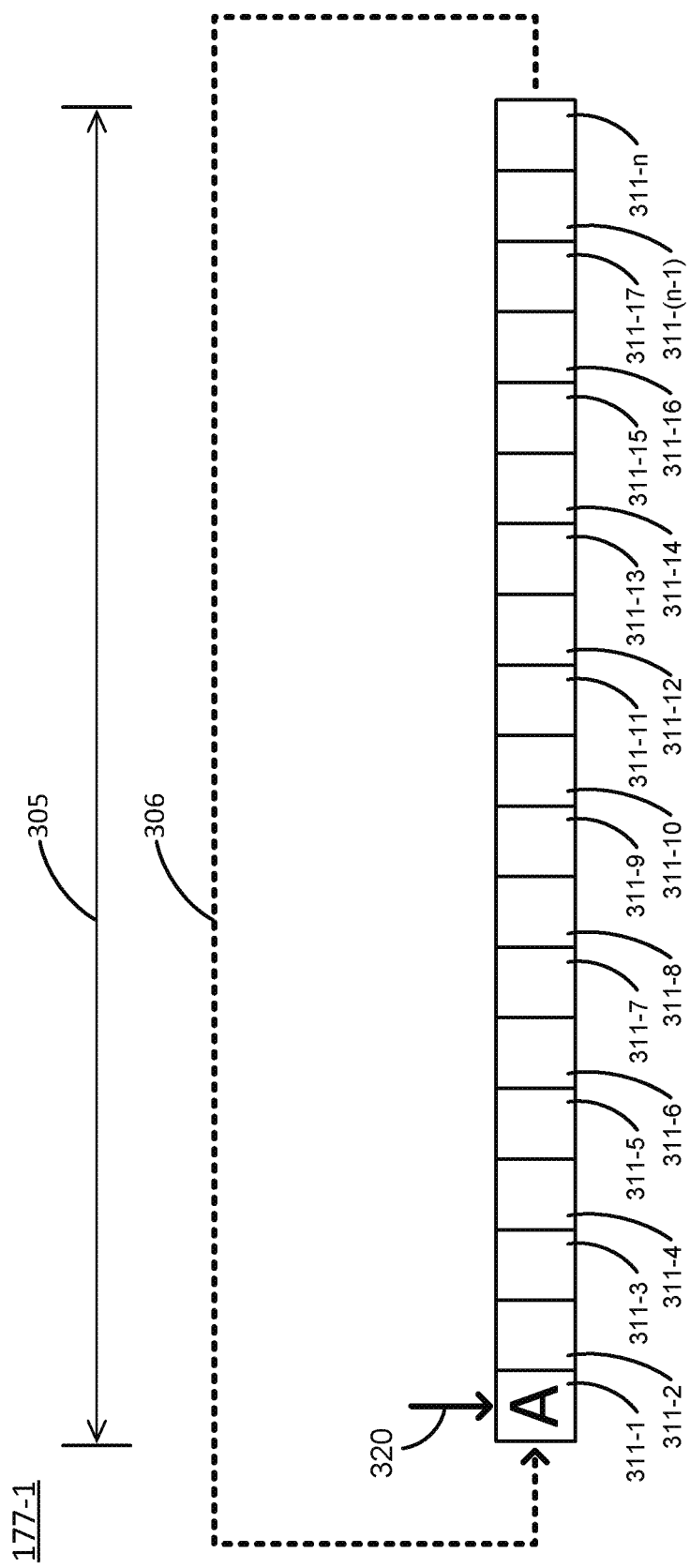
FIG. 3A illustrates a block diagram of a circular data buffer of a sensor processing unit, according to various embodiments.

FIG. 3A illustrates block diagram of a circular data buffer 177-1 of a sensor processing unit 170, according to various embodiments. Circular data buffer is a data structure that uses a single, fixed-size memory 305 and collection of its ordered memory addresses 311 (311-1, 311-2, 311-3, 311-4, 311-5, 311-6, 311-7, 311-8, 311-9, 311-10, 311-12, 311-13, 311-14, 311-15, 311-16, 311-17 . . . 311-($n$–1), and 311-$n$) as if the ordered memory addresses were connected end-to-end (e.g., 311-$n$ connected back to 311-1 as shown by dashed line 306). In FIG. 3A, all of memory addresses 311 are blank and unwritten except for address 311-1. Write pointer 320 is shown pointing to address 311-1 and a first portion of data received from a sensor 178 (e.g., acoustic sensor 178-2) has been written as represented by the capital letter "A." In this example, it should be appreciated that the data is a binary or other representation of acoustic data and is not actually the letter "A." Likewise, in other examples illustrated and described herein, the capital letters depicted in memory addresses 311 are merely symbolic representations and are not intended to be visual depictions of the actual received data. The size of circular data buffer 177-1 may depend, for example, on the type of sensor, the type of sensor data, the application the sensor data is intended for, or the power mode of the sensor processing unit 170 or mobile electronic device 100. In one embodiment, circular data buffer 177-1 may be of sufficient size to buffer several seconds (e.g., 3-10 seconds of data received from a sensor 178), before beginning to overwrite itself with newly received data after circling back to the same memory addresses that were previously written with buffered data. In various embodiments, received data from a sensor 178 may be continuously written in a circular fashion into circular data buffer 177-1 in a raw or processed fashion as the data streams in from the sensor.

In some embodiments, as the streamed data is received from a sensor 178, sensor processor 172 continually detects for the appearance of triggering data within the stream. This detection may be done by comparing the data, or section of the data, in the buffer to the triggering data. When the streamed data is from an acoustic sensor the triggering data may be an acoustic pattern that matches a specific sound or a word or series of words spoken by a human. The word or series may comprise a command (e.g., a wake-up command) which may be followed by an instruction. Sensor processor 172 may operate a speech recognition algorithm that is tailored to recognize a single spoken word, a small set of spoken words, and/or one or more short spoken phrases. For example, and without limitation, sensor processor 172 may be configured to recognize the word "awaken," or the phrase "hey siri," or the phrase "wake up" or the phrase "OK google" as a keyword/phrase that is the triggering data within the received data from a sensor 178. Detection of this triggering data causes sensor processor 172 to send a command to a second processor. In some embodiments, the command is a wake-up command sent to host processor 110 commanding it to power-up to a higher operational mode from a low-power mode.

Start-End Marker Setting

In general a start-end marker may be set in circular data buffer 177-1 at a position relative to the triggering data, for example, in advance of triggering data, at the beginning point of triggering data, or at the end of triggering data. The location at which a start-end marker is set may be adapted, without limitation thereto, based on one or more of: the type of sensor data being recorded, the timeliness in which a host processor can be awaked so that buffered data can be forwarded out of circular data buffer 177-1 before being overwritten, the speed at which buffered data can be read out of circular data buffer 177-1, and the type (if any) of validation and/or processing that is to be accomplished by a second processor on the buffered data.

Figure 3B:
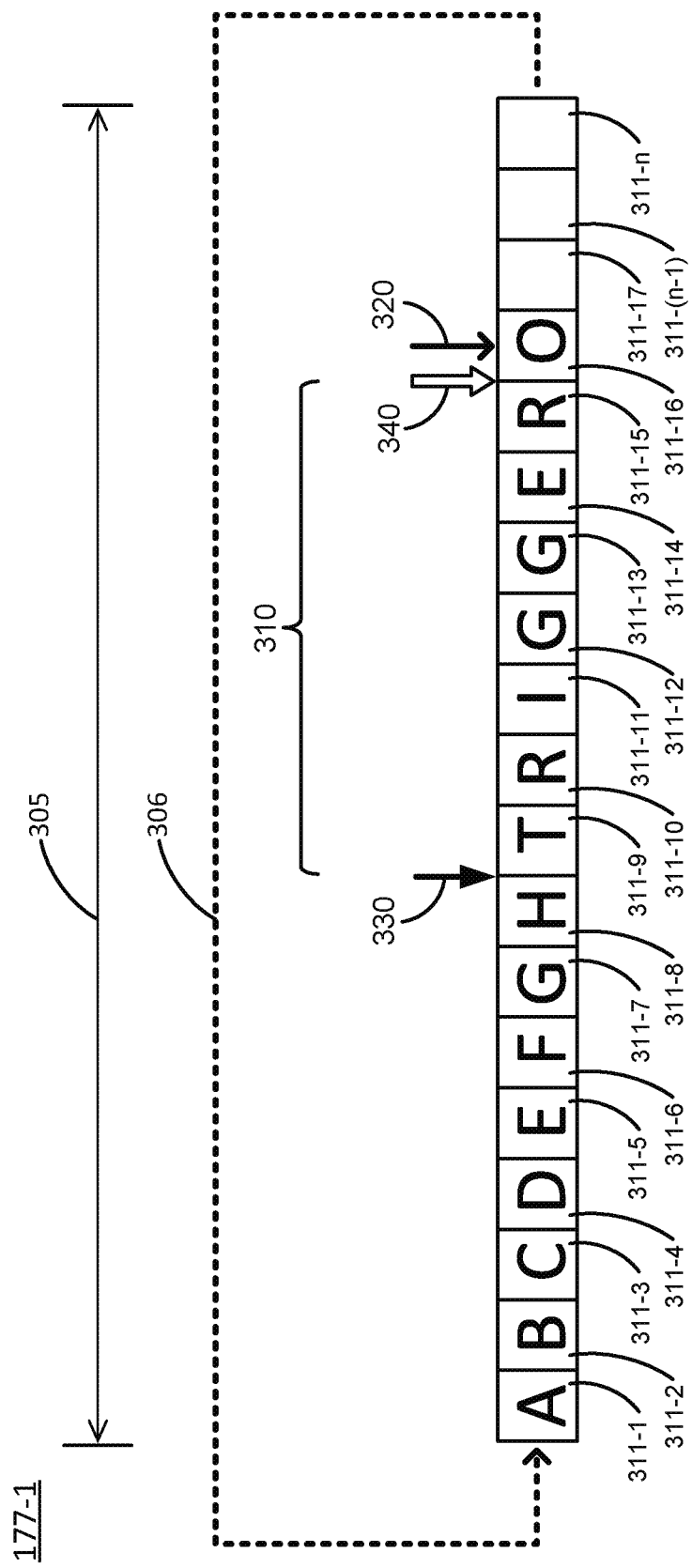
FIG. 3B illustrates example data buffering operations with the circular data buffer of FIG. 3A which take place in response to the sensor processor detecting triggering data, according to various embodiments.

FIG. 3B illustrates example data buffering operations with the circular data buffer 177-1 of FIG. 3A which take place in response to the sensor processor (e.g., 172) detecting triggering data 310, according to various embodiments. In FIG. 3B, write pointer 320 is positioned at memory address 311-16, and memory addresses 311-1 to 311-16 have been sequentially written with received data. In an example where received data is being received from an acoustic sensor 178, sensor processor 172 has detected triggering data 310, such as via speech recognition, in memory addresses 311-9 to 311-15. In response to detecting of the triggering data 310 within the received data, sensor processor 172 has set a start-end marker 330. Setting start-end marker 330 marks the beginning of the buffer content that is retained and used for the next stage, such as being passed to a second processor. The 'T' in buffer address 311-9 represents the new beginning of circular data buffer 177-1. The 'H' in buffer address 311-8 represents the new end of circular data buffer 177-1 (before starting to overwrite). In various embodiments, the second processor may be a host processor 110 of mobile device 100, an external processor 210 in a datacenter (e.g., in the "cloud"), or an external processor 210 in an electronic device that is separate from mobile device 100). Start-end marker 330 also marks a circular end of circular data buffer 177-1, as an address that should not be overwritten until the received data buffered in it can be transmitted elsewhere and/or until it can be confirmed that an action has taken place such as waking up a host processor. As will be further discussed, various adaptive buffering techniques may be implemented to prevent unintentional overwriting of the starting memory address marked by the start-end marker 330.

Figure 3C:
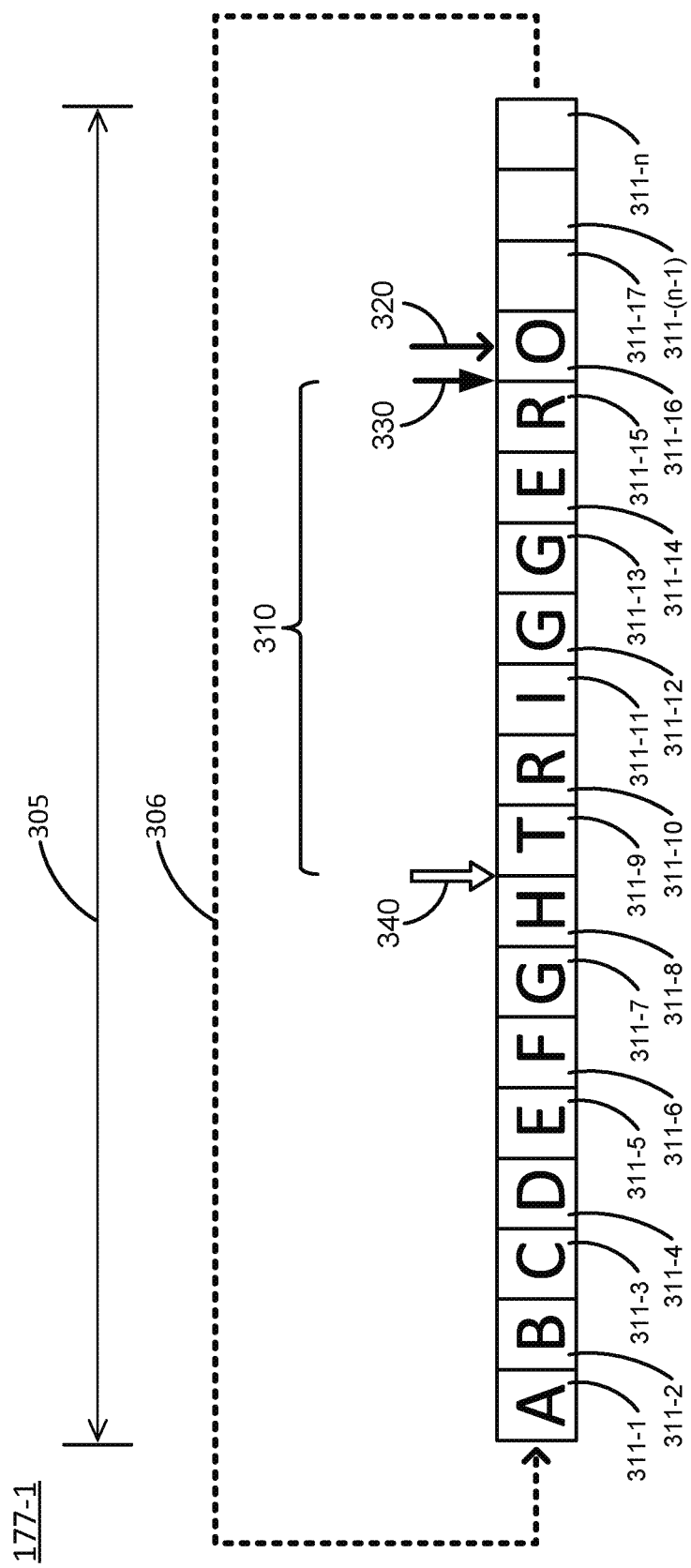
FIG. 3C illustrates example data buffering operations with the circular data buffer of FIG. 3A which take place in response to the sensor processor detecting triggering data, according to various embodiments.
Figure 3D:
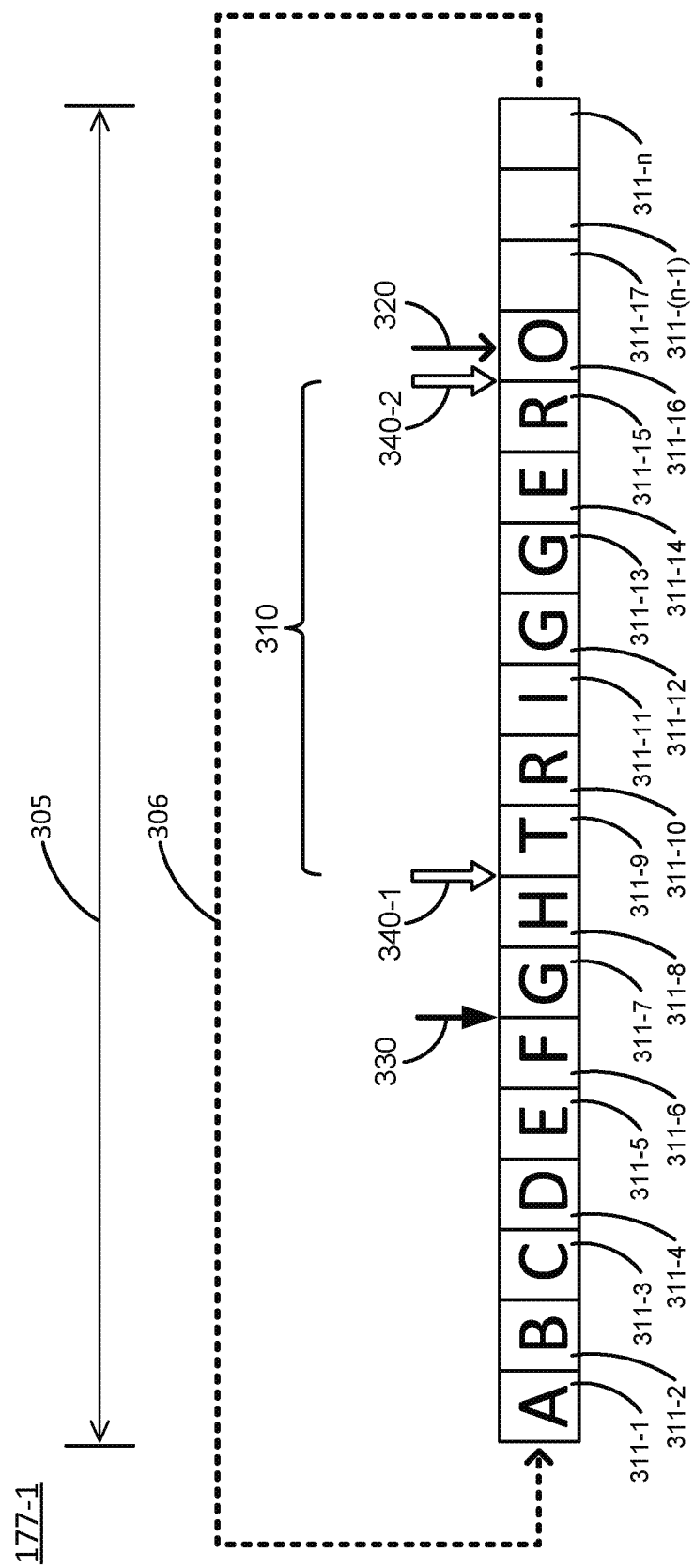
FIG. 3D illustrates example data buffering operations with the circular data buffer of FIG. 3A which take place in response to the sensor processor detecting triggering data, according to various embodiments.

As depicted in FIG. 3B, sensor processor 172 has placed start-end marker 330 at the beginning of the triggering data 310. Start-end marker 330 may be positioned in places other than at the beginning of triggering data 310, in other embodiments. FIG. 3C and FIG. 3D show some examples other positions that a start-end marker 330 may be placed by sensor processor 172.

In some embodiments, sensor processor 172 may additionally set one or more data markers 340 to mark or point to various portions of data of interest. In FIG. 3B, data marker 340 has been positioned at the end of triggering data 310. In this fashion, start-end marker 330 marks the beginning (memory address 311-9) and data marker 340 marks the end (memory address 311-15) of the range of received data that comprises the triggering data 310. In some embodiments, one or more data markers 340 may be used to identify or indicate specific section of a command that follows the triggering data 310. In some embodiments, triggering data 310 and/or a command, or sections of commands, are transmitted elsewhere to a second processor for reprocessing and/or validation and these markings denote which portion of the buffered received data should be sent. By setting start-end marker 330 at the beginning of the triggering data 310, buffering can be adapted to preserve the triggering data 310 and prevent it from being unintentionally overwritten.

FIG. 3C illustrates example data buffering operations with the circular data buffer 177-1 of FIG. 3A which take place in response to the sensor processor (e.g., 172) detecting triggering data 310, according to various embodiments. FIG. 3C is similar to FIG. 3B except that start-end marker 330 has been set at the end of the triggering data 310 and data marker 340 has been set at the beginning of triggering data 310. In this fashion, data marker 340 marks the beginning (memory address 311-9) and start-end marker 330 marks the end (memory address 311-15) of the range of received data that comprises the triggering data 310. In some embodiments, triggering data 310 is transmitted elsewhere to a second processor for reprocessing and/or validation and these markings denote which portion of the buffered received data should be sent. By setting start-end marker 330 at the end of the triggering data 310, buffering can be adapted to preserve buffered received data just after the triggering data 310 and prevent it from being unintentionally overwritten. This is useful when the sensor processor issues a command based on the triggering data 310, but may not be configured to recognize a follow-on command, instruction, or request that may immediately follow the triggering data 310. Setting the start-end marker 330 at the end of triggering data 310 frees up more buffer space for buffering a command, instruction, or request following the keyword of represented in triggering data 310, but does not allow a validation of the triggering data 310 in a later stage if the triggering data 310 happens to be overwritten before it can be transmitted to another location for validation.

FIG. 3D illustrates example data buffering operations with the circular data buffer 177-1 of FIG. 3A which take place in response to the sensor processor (e.g., 172) detecting triggering data 310, according to various embodiments. FIG. 3D is similar to FIG. 3B except that start-end marker 330 has been set a predetermined distance (e.g., two memory addresses) in front of triggering data 310 at the beginning of buffer address 311-7. In this embodiment, two data markers 340 have been set as well. Data marker 340-1 is set at the beginning of triggering data 310, and data marker 340-2 is set at the end of the triggering data 310. In this fashion, data markers 340-1 and 340-2 denote the range of buffered data that comprises the triggering data 310. In some embodiments, triggering data 310 is transmitted elsewhere to a second processor for reprocessing and/or validation and these markings denote which portion of the buffered received data should be sent. In some embodiments, some predetermined additional received data immediately prior to the triggering data may also be transmitted elsewhere to a second processor along with the triggering data 310. By setting start-end marker 330 a predetermined distance in front of the triggering data 310, buffering can be adapted to preserve this buffered received data just prior to the triggering data 310 and prevent it from being unintentionally overwritten.

Extending the buffer content to a time before the start of detection of triggering data 310 in the fashion illustrated in FIG. 3D enables validation (e.g., re-doing/double-checking) of the triggering data detection from a time period before the occurrence of the already "identified" triggering data 310. This allows for the context of the appearance of the triggering data 310 to also be evaluated as part of the validation. This validation is performed with a more sophisticated algorithm at a later stage (e.g., after being transmitted to a more sophisticated second processor than sensor processor 172). This validation can place mobile device 100 and its host processor 110 back in low-power mode without fully awakening or else shortly after awakening, in case of a false positive. In this example, a false positive means that the sensor processor recognized the triggering data, but that the second processor, using a more sophisticated algorithm, did not confirm that the data was indeed equal to the triggering data. This conserves power over the case where no validation of a false positive is accomplished and mobile device 100 needlessly awakens from a low-power mode for a longer period of time before returning to a low-power mode. Furthermore, providing context in advance of the triggering data 310 detected by sensor processor 172 may facilitate noise suppression if the acoustic environment itself turns out to be of no interest. For example, determining the noise characteristics that occur before the suspected triggering data 310, allows the second processor to remove that noise during the triggering data validation by the second processor). In some embodiments, the validation may even be done by the sensor processing unit 170 itself. For example, in a very low power mode the sensor processing unit 170 may use a basic algorithm to detect the triggering data, and if the triggering data is detected, the sensor processing unit 170 may validate the triggering data itself using a more sophisticated algorithm which may use e.g., the noise characteristics determined (and buffered) before the triggering data, and may require a slightly higher power mode. Such embodiments enable a reduction of false positives at the sensor processing unit 170 level, and avoids unnecessary waking up the host processor.

Extending the buffered content to a time before the start of the triggering data 310 in the fashion illustrated in FIG. 3D also allows a glimpse of the context at the time before the triggering data 310 was detected by sensor processor 172. The context may be an environmental context, a context of what the user was doing in the real world (riding a train, walking, etc.), and/or some other context. In some instances, the triggering data 310 itself may have been a direct reaction to something that happened in the environment (e.g., a voice on TV, a fire-truck siren, an airport terminal announcement, a song, etc.). For example, a user may ask "OK Google," as triggering data 310, followed by an instruction of "what is this song." Using the technique illustrated in FIG. 3D, circular data buffer 177-1 will already be filled with part of the song for immediate analysis. The data before the triggering data may be of relevance to the triggering data or to any command data that may follow the triggering data. Therefore, conserving this data by placing the start-end marker before the triggering data may provide additional useful information. In some embodiments, the sensor processing unit 170 may be able to analyze some of the context, and may adapt the position of the markers, such as e.g., start-end marker 330, based on the detected context. For example, for some applications a larger section of context data covering a wider time spam may be useful, meaning that the start-end market 330 is positioned at a lower memory position, at a larger distance from the start of the triggering data 310.

Host Processor Preoccupation

Once triggering data 310 has been detected, sensor processor 172 may make a decision to send a command, such as an interrupt, to alert a second processor, such as host processor 110. There is no telling what the host processor 110 may be doing. It may be asleep or in a low-power mode, or it may be pre-occupied with one or more tasks that prevent an immediate response. If preoccupied, it may take some amount of time for the host processor to respond to the command. During this wait time between sending a command and notification to sensor processor 172 that host processor 110 is responsive, sensor processor 172 will keep filling the circular data buffer 177-1 with sensor data that is received after triggering data 310. In many embodiments, the data received and buffered immediately after the triggering data 310 contains a command, instruction, or request from the user. Once host processor 110 is available, sensor processor 172 will start reading data out to host processor 110 from where start-end marker 330 (which doubles as the initial position of a read marker) is positioned. While reading the buffered data out to host processor 110, circular data buffer 177-1 continues being filled with data received from the sensor 178. The read speed must be as fast or faster than real-time in order not to get 'overtaken' by the write pointer of circular data buffer 177-1. Any processing that was being done by sensor processor 172 (e.g., noise cancelation, compression, etc.) may continue or be discontinued. In some embodiments, as soon as the host processor 110 is available to process data, all data from circular data buffer 177-1 is transferred to a buffer/memory (e.g., host memory 130) associated with host processor 110, and the new incoming data from sensor 178 is directly transferred to host processor 110 and/or its buffer.

Host Processor Wake-Up

Once triggering data 310 has been detected, sensor processor 172 may make a decision to send a command, such as an interrupt, to wake host processor 110 from a low-power mode so that it enters a higher power mode where it is capable of performing more tasks. It will take some amount of time for the wake-up to occur. During this wait time between sending a wake-up command and notification to sensor processor 172 that host processor 110 is powered up to a higher power mode, sensor processor 172 will keep filling the circular data buffer 177-1 with sensor data that is received after triggering data 310. In many embodiments, the data received and buffered immediately after the triggering data 310 contains a command, instruction, or request from the user. Once host processor 110 is awake, sensor processor 172 will start reading data out to host processor 110 from where start-end marker 330 (which doubles as the initial position of a read marker) is positioned. While reading the buffered data out to host processor 110, circular data buffer 177-1 continues being filled with data received from the sensor 178. The read speed must be as fast or faster than real-time in order not to get 'overtaken' by the write pointer of circular data buffer 177-1. Any processing that was being done by sensor processor 172 (e.g., noise cancelation, compression, etc.) may continue or be discontinued. In some embodiments, as soon as the host processor 110 is awake, all data from circular data buffer 177-1 is transferred to a buffer/memory (e.g., host memory 130) associated with host processor 110, and the new incoming data from sensor 178 is directly transferred to host processor 110 and/or its buffer.

Limited Wake-Up

As discussed above and elsewhere herein, circular data buffer 177-1 may be used to store the received data from a sensor 178 while host processor 110 is in low-power mode and while waiting for host-processor 110 to start up or awaken to a higher power mode. However, in some embodiments, host processor 110 does not need to be awakened, but can remain asleep/in a low-power mode, depending on the commands, instructions, or requests (if any) which follow triggering data 310. That is, for simple commands, instructions, or requests that can be interpreted and carried out by sensor processor 172, a wake-up command is not sent from sensor processor 172 to host processor 110. Instead, the wake-up command is limited to being sent in response to the occurrence of more complex commands, instructions, or requests than can be interpreted and/or carried out by sensor processor 172 or intermediate processor or hardware that might otherwise be notified/controlled by sensor processor 172. Consider an example, where the user speaks "OK Google" which is interpreted by sensor processor 172 as triggering data 310, and follows this by speaking "set the alarm for 6 AM." In an embodiment where sensor processor 172 is configured to recognize certain instructions, such as alarm setting instructions, sensor processor 172 may set the alarm of mobile device 100 without waking host processor 110. In these limited-wakeup embodiments, the buffering needs to be longer than simply storing the triggering data 310 until the host processor 110 wakes up from a low-power more. The sizing of circular data buffer 177-1 depends on the types of commands required to be recognized. For very low-power implementations, only limited short commands may be allowed to reduce the buffer size and the associated power consumption of sensor processing unit 170.

Although the examples herein mainly focus on an acoustic sensor 178 with keyword spotting being accomplished to detect triggering data 310, they are not so limited. It should be appreciated that the same principles also apply after triggering data is detected in received data from a motion sensor, image sensor, or other sensor. For example, triggering data may be detected after receiving motion sensor data which measures a predefined motion triggering event or after receiving image sensor data represents a predefined visual triggering event. Following such triggering data detection, sensor processing unit 170 may send a command to a second processor, such as a host processor, and/or take action of its own. The command may alert, awaken, or initiate a process at the second processor.

Adaptive Compression

The following fundamental classes of compression can be distinguished and utilized with embodiments described herein: 1) No compression (highest data rate, and no computational power spent on compression/decompression); 2) Lossless compression (medium data rate, dependent on compressibility of received data, and output after decompression is indistinguishable from data that has not been compressed); and 3) Lossy compression (lowest data rate of the three levels, independent of captured data, requires the most processing power, and after decompression the decompressed data may be degraded).

Unlike compression classes 1 and 2, methods of class 3 have the potential to degrade the performance of certain detection and classification algorithms, due to degradation of received data after decompressing. Depending on the application, this may be acceptable. For instance, lossy compression may be acceptable for the triggering data 310 portion of the buffered data that the sensor processor 172 has already processed before compression. This is because the one of the only purposes of saving the triggering data it is validating the detection result on another processor.

In order to make appropriate trade-offs between the data reduction rate from compression and the performance of the detection or recognition task performed, the compression mechanism is adaptive. For example, FIGS. 3B-3D illustrate the use of no compression (e.g., class 1) with respect to received data that is buffered, while FIGS. 3E-3G show some examples of adapting compression from class 1 to class 2 and/or class 3.

Figure 3E:
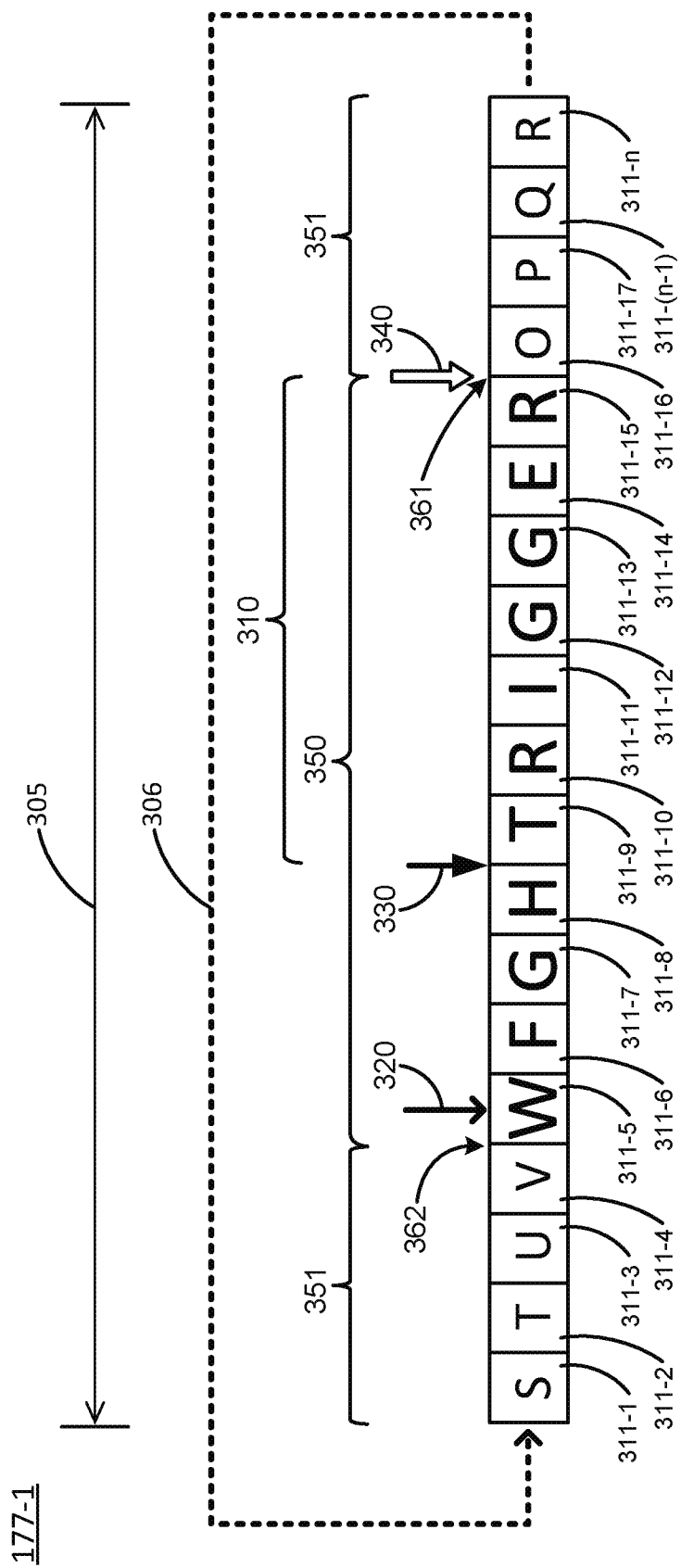
FIG. 3E illustrates example data buffering operations with the circular data buffer of FIG. 3A which take place in response to the sensor processor detecting triggering data, according to various embodiments.

FIG. 3E illustrates example data buffering operations with the circular data buffer 177-1 of FIG. 3A which take place in response to the sensor processor (e.g., 172) detecting triggering data 310, according to various embodiments. FIG. 3E illustrates a write marker 320 positioned above buffer address 311-5, a buffer start-end marker 330 positioned at the beginning of triggering data 310, and a data marker 340 at the end of triggering data 310 in the manner illustrated in FIG. 3B. After detection of triggering data 310, sensor processor 172 has sent a command (e.g., a wake-up command or other command) to a second processor (e.g., to host processor 110 or an external processor 210). As illustrated in FIG. 3E, the command is sent at a time/position of circular data buffering indicated by arrow 361. It should be appreciated that there may be some time required for sensor processor 172 to analyze the triggering data 301 locally, so there may be some time delay before the end of the triggering data and the time the signal to wake up the host processor is send, accordingly in some embodiments the time/position indicated by arrow 361 may actually be shifted to 311-16, 311-17, etc, due to analysis lag. Later, at a time/position of circular data buffering indicated by arrow 362, sensor processor 172 receives a notification that host processor 110 has powered up from its low-power state and is ready to receive data.

Font size of the letters in the buffer addresses visually depicts compression of the represented received data, with the largest font representing uncompressed data and with shifts to smaller fonts representing increased compression. In region 350, a first class of compression (e.g., no compression) is employed in buffer addresses 311-6, 311-7, and 311-8 for received data that was buffered before triggering data 310 and is also employed again, later in time, in buffer address 311-5 for received data that was buffered (and overwritten) after notification that processor 110 had awoken/powered-up/become available (as indicated by arrow 362). Region 350 also covers triggering data 310 in buffer addresses 311-9 through 311-15. In regions 351, a second class of compression (e.g., lossless compression) has been employed for buffering of data received after the triggering data 310 but before notification that host processor 110 had awoken/powered up at time/position 362. In this example, the compression changes from a first class of compression to a second class of compression at the end of the triggering data 310. It may also change back to the first class of compression, as illustrated at arrow 362, after notification that processor 110 had awoken/powered-up/become available. In one embodiment, the first class of compression may consist of a higher level of compression compared to the second class of compression because the triggering data 310 will not be reanalyzed. In another embodiment, the first class of compression may consist of a lower level of compression compared to the second class of compression because the triggering data 310 will be reanalyzed, and the higher level of compression of the second class enables a more efficient storage of data after the triggering data, 310 such as e.g., a command, which is typically longer than the triggering data 310.

Figure 3F:
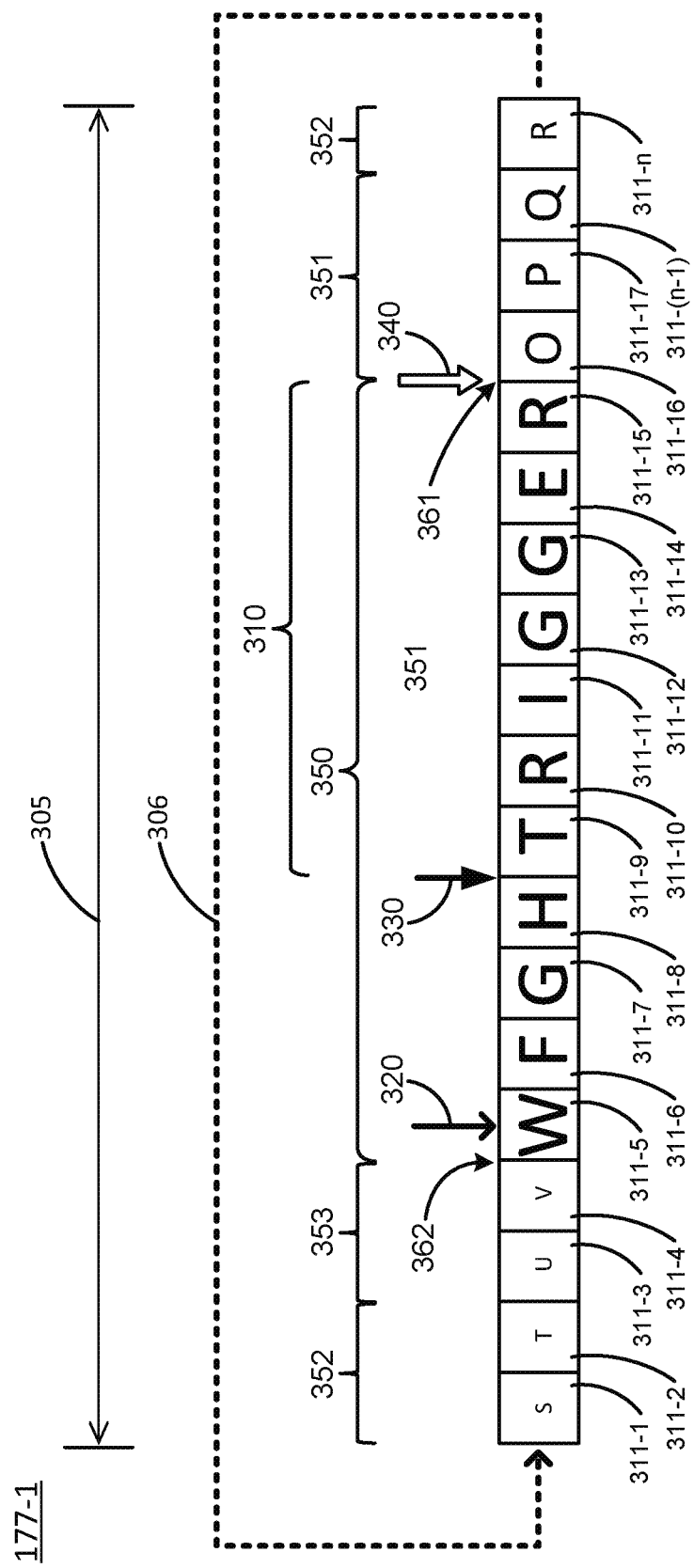
FIG. 3F illustrates example data buffering operations with the circular data buffer of FIG. 3A which take place in response to the sensor processor detecting triggering data, according to various embodiments.
Figure 3G:
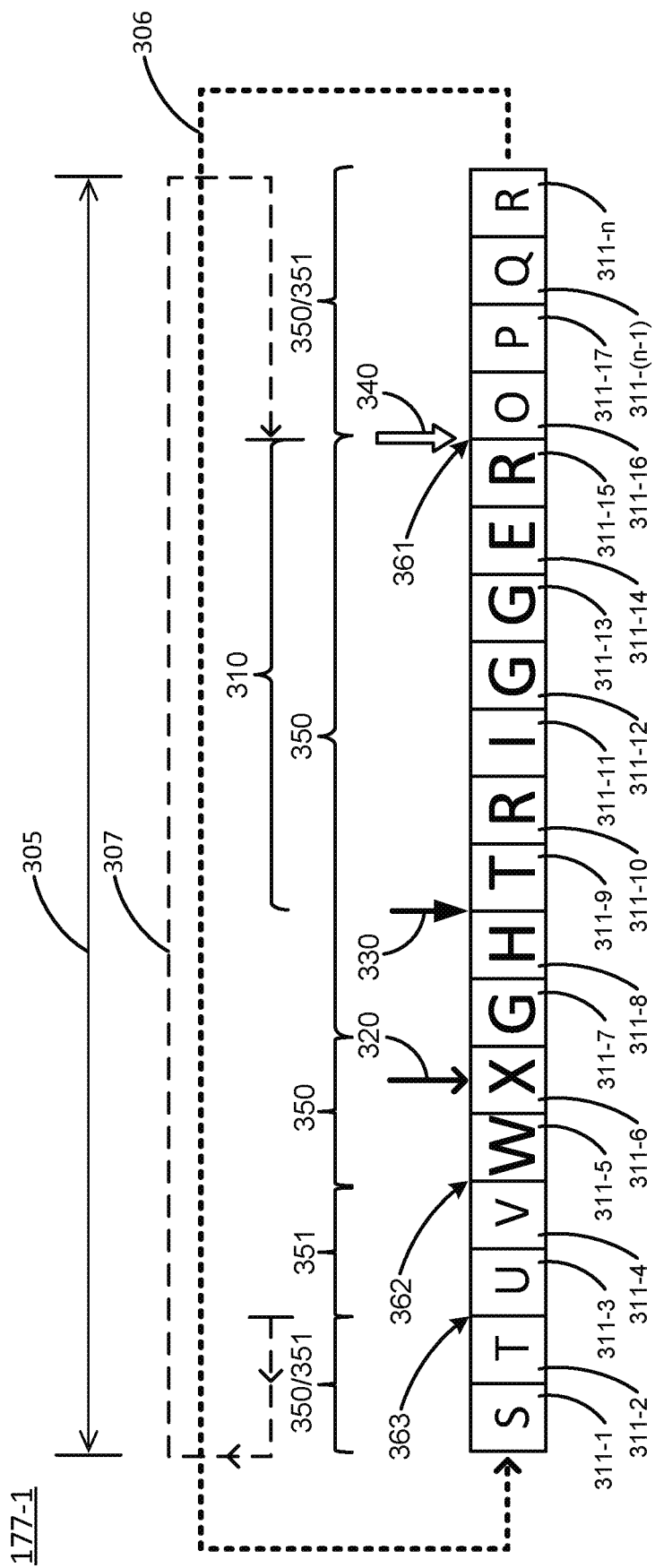
FIG. 3G illustrates example data buffering operations with the circular data buffer of FIG. 3A which take place in response to the sensor processor detecting triggering data, according to various embodiments.

FIG. 3F illustrates example data buffering operations with the circular data buffer 177-1 of FIG. 3A which take place in response to the sensor processor (e.g., 172) detecting triggering data 310, according to various embodiments. FIG. 3F illustrates a write marker 320 positioned above buffer address 311-5, a buffer start-end marker 330 positioned at the beginning of triggering data 310, and a data marker 340 positioned at the end of triggering data 310 in the manner illustrated in FIG. 3B. After detection of triggering data 310, sensor processor 172 has sent a command (e.g., a wake-up command or other command) to a second processor (e.g., to host processor 110 or an external processor 210). This command is sent at a time/position of circular data buffering indicated by arrow 361. Later, at a time/position of circular data buffering indicated by arrow 362, sensor processor 172 receives a notification that host processor 110 has powered up from its low-power state.

Font size of the letters in the buffer addresses visually depicts compression of the represented received data, with the largest font representing uncompressed data and with shifts to smaller fonts representing increased compression. In region 350, a first class of compression (e.g., no compression) is employed in buffer addresses 311-6, 311-7, and 311-8 for received data that was buffered before triggering data 310 and is also employed in buffer address 311-5 for received data that was buffered (and overwritten) after notification that processor 110 had awoken/powered-up/ become available (as indicated by arrow 362). Region 350 also covers triggering data 310 in buffer addresses 311-9 through 311-15. In region 351, a second class of compression (e.g., lossless compression) has been employed for buffering. In regions 352, a third class of compression (lossy compression) has been employed for buffering data received after the triggering data 310 for buffer addresses 311-17 to 311-n. In region 353, a more aggressive form of the third class of compression has been employed for buffering data into buffer addresses 311-1 to 311-4, until notification that host processor 110 had awoken/powered-up/become available. The second class of compression may have a lower level of compression than the third class of compression, for example, the second class may be lossless compression and the third class may be lossy compression.

FIG. 3F illustrates that as circular data buffer 177-1 gets filled following detection of triggering data 310, the compression is increased. Many different scenarios are possible while increasing the compression as the buffer fills. Different sections of the buffer may use the same compression algorithm but with a different strengths or bit rates, or may use different algorithms. The buffer fill level, which is given, for example, by the distance of the current circular data buffer write pointer 320 from start-end marker 330, can be used for controlling the data compression rate. Alternatively, the buffer fill level may be determined with respect to the available space for the command, being from the end of the triggering data 310 until the start-end marker 330. Sensor processor 172 determines the buffer fill level or level of fullness. In some embodiments, this involves progressively moving to higher compression rates as the buffer fill level approaches start-end marker 330. When switching between compression methods with different processing delays, care must be taken that the algorithms are delay-aligned. In some embodiments, cross-fading between different sections may also be used, with different widths of the fading (which may depend on mechanisms used or signal content). This means that in the overlap regions two compression schemes run in parallel, which decreases buffer efficiency and creates a temporary spike in the data rate but may increase quality. In some embodiments, a compression scheme is used that adds a lossless complementary layer to a lossy core stream (e.g., the WavPack audio compression format), and as the buffer fills up, the lossless complementary layer is dropped.

Buffer locations at which the compression scheme is changed need to be known, and are typically fixed in advance and known to sensor processor 172 or else are marked and stored (such as at the end of circular data buffer 177-1).

The change in compression may depend on the buffer fill level, which may be determined in the size of allocated memory or in percentage, fractions. These fractions may be identical, for example, a first third of the buffer may use a first compression level, a second third of the buffer may use a second compression level, and a last third of the buffer may use a third compression level. Alternatively, the size of the fractions may vary, for example, a first half of the buffer may use a first compression level, then for the second half, a first quarter of the buffer may use a second compression level, and a last quarter of the buffer may use a third compression level. The compression strength, or the effective gain in space, may increase e.g., in a linear or more aggressive fashion.

FIG. 3G illustrates example data buffering operations with the circular data buffer 177-1 of FIG. 3A which take place in response to the sensor processor (e.g., 172) detecting triggering data 310, according to various embodiments. FIG. 3G illustrates a write marker 320 positioned above buffer address 311-6, a buffer start-end marker 330 positioned at the beginning of triggering data 310, and a data marker 340 positioned at the end of triggering data 310 in the manner illustrated in FIG. 3B. After detection of triggering data 310, sensor processor 172 has sent a command (e.g., a wake-up command or other command) to a second processor (e.g., to host processor 110 or an external processor 210). This command is sent at a time/position of circular data buffering indicated by arrow 361. Later, at a time/ position of circular data buffering indicated by arrow 362, sensor processor 172 receives a notification that host processor 110 has powered up from its low-power state.

Font size of the letters in the buffer addresses visually depicts compression of the represented received data, with the largest font representing uncompressed data and with shifts to smaller fonts representing increased compression. In regions 350, a first class of compression (e.g., no compression) is employed in buffer addresses 311-7 through 311-n, and continuing to 311-1 and 311-2, and again in buffer addresses 311-5 and 311-6. In region 350/351, the first class of compression is initially employed in the manner of the compression show in region 350 and then the data stored in this region is recompressed to a second level of compression which has a higher compression level that is also employed in region 351. The arrow 363 after buffer address 311-2 represents the point where a predetermined fill level of the buffer has been reached. At this point the sensor processing unit 170 decides to change the compression from a first class of compression to a second class of compression (e.g., lossless compression) of at least part of the data already in the buffer. The part that is recompressed may run back to the start-end marker 330, and this includes also recompression of the triggering data 310. Alternatively, the recompressing may run back to the end of the triggering data 310 (e.g., data marker 340), as is depicted in this example as is indicated by arrow 307, from buffer address 311-2 back to 311-16 shown as region 350/351. Note that FIG. 3G represents the situation after the recompression has taken place using a second class of compression. The recompression is performed by sensor processor 172 and involves reading the data that has a first class of compression, applying a second class of compression, and then writing back the data into the buffer. When the second class of compression has a higher compression level than the first class, the writing back the data will require less buffer addresses which will allow for more total data buffering (this aspect in not shown in FIG. 3G). After the recompression of region 350/351 from a first class of compression to a second class of compression, the next incoming data for buffer address 311-3 and further, as illustrated by region 351, is immediately stored using the second class of compression until notification that host processor 110 had awoken/powered-up/become available at the location of arrow 362. Such recompression adds more storage space to circular data buffer 177-1 to further delay overwrite of the start-end marker while waiting for a host-processor wakeup/power-up notification/availability. The example of FIG. 3G shows a single recompression after reaching a certain buffer fill level. In some embodiments, a plurality of recompressions may take place at different fill levels. For example, a first recompression using a second class of compression (e.g., lossless compression) may be applied at a first fill level, and at a later stage if even more space is required, a second recompression using a third class of compression (e.g., lossy compression) may be applied at a second fill level.

Adaptive Compression Settings

Adaptive compression settings, which include the choice of the compression strategy, compression algorithm, the number of different compression levels, and the variation in the compression strength, may depend on many different factors. For example, these settings may depend on the size or type of buffer. Bigger buffers may allow for more variation and a more optimal use of buffer size. The adaptive buffer settings may also depend upon the active application using the buffer, or the type of data stored in the buffer. Similarly, the settings may depend on the type of sensor for which the buffer is used, because the type of sensor determines the type of data produced, volume of data produced, and compressibility of the data. The settings may depend upon the required accuracy of the data or the required accuracy of the outcome of the process or function that the data is intended for. Triggering data 310 size or content may also influence the adaptive compression settings. In case the content of the triggering data 310 may determine the settings, this analysis and control must be done locally by sensor processor 172.

Adaptive compression settings may also depend on the power settings. For example, the more complicated the compression, the more power the calculations require, and so in a low-power mode certain compression settings may require too much power. In some embodiments, the settings may determine that although a certain amount of buffer size is available in hardware, not all of the hardware buffer may be used to save energy. This may depend on the trade-off between the energy it takes to operate the memory, and the energy it takes to run the compression algorithms. For example, less memory available may require more aggressive compression which may potentially require more energy.

Example Methods of Operation

FIGS. 4A-4G illustrate a flow diagram 400 of an example method of adaptive buffering in a mobile device having a host processor and a sensor processor coupled with the host processor, according to various embodiments. Procedures of this method will be described with reference to elements and/or components of one or more of FIG. 1, FIG. 2, and FIGS. 3A-3G. It is appreciated that in some embodiments, the procedures may be performed in a different order than described, that some of the described procedures may not be performed, and/or that one or more additional procedures to those described may be performed. Flow diagram 400 includes some procedures that, in various embodiments, are carried out by one or more processors under the control of computer-readable and computer-executable instructions that are stored on non-transitory computer-readable storage media (e.g., memory 176). It is further appreciated that one or more procedures described in flow diagram 400 may be implemented in hardware, or a combination of hardware with firmware and/or software.

With reference to FIG. 4A, at procedure 410 of flow diagram 400, in various embodiments, a sensor processor is used to buffer data received from a sensor that is operated by the sensor processor. The data is buffered by the sensor processor into a circular data buffer. In various embodiments, this comprises sensor processor 172 receiving data from a sensor 178 (e.g., an acoustic sensor 178-1) and then buffering the received data into a circular data buffer 177-1.

With continued reference to FIG. 4A, at procedure 420 of flow diagram 400, in various embodiments, responsive to the sensor processor detecting triggering data within the received data the procedures described 422 and 424 are carried out. In various embodiments, this comprises sensor processor 172 detecting for triggering data 310 in the form of a keyword/phrase in a digital audio stream, and/or a predefined motion event in a digital motion data stream from a motion sensor 178 (for example, sensor 178-3 may be a motion sensor in some embodiments), and/or a predefined visual event in a digital visual data stream from an image sensor (for example, sensor 178-n may be an image sensor in some embodiments). Responsive to detection of triggering data 310, sensor processor 172 carries out other procedures, such as the procedures described in 422 and 424 of FIG. 4A.

With continued reference to FIG. 4A, at procedure 422 of flow diagram 400, in various embodiments, a start-end marker is set in the circular data buffer by the sensor processor. In various embodiments, this comprises sensor processor 172 setting start-end marker 330 in circular data buffer 177-1. The start-end marker can be set at various positions depending on, for example, the capabilities of sensor processor 172 to process triggering data 310 with/without validation and whether additional context data is being preserved for further processing apart from sensor processor 172. As is illustrated in FIG. 3B, in some embodiments sensor processor 172 sets the start-end marker at the beginning of triggering data 310. As is illustrated in FIG. 3C, in some embodiments sensor processor 172 sets the start-end marker at the end of triggering data 310. As is illustrated in FIG. 3D, in some embodiments sensor processor 172 sets the start-end marker at some predetermined distance (the distance may be measured in memory addresses or time as related to buffering speed) in advance of the beginning of triggering data 310 in order to capture context from received data buffered just before detection of triggering data 310.

With continued reference to FIG. 4A, at procedure 424 of flow diagram 400, in various embodiments, the sensor processor sends a command from the sensor processor to a second processor. In various embodiments, this comprises sensor processor 172 sending the command to the second processor which may be host processor 110 and/or a processor 210 that is external to mobile electronic device 100. It should be appreciated that external processor 210 may be located in another mobile electronic device, in a stand-alone computer system, in a datacenter (e.g., in a "cloud" of Internet connected shared on demand computing resources), etc. In some embodiments, the triggering data may be packaged with or otherwise sent to the second processor along with or as part of the command.

In some embodiments, the command may be a wake-up command that causes the second processor to exit a low-power mode in which it conserves power but has fewer processing capabilities and enter a higher power mode, such as a full-power mode, which consumes more power but allows the second processor to perform more processing tasks. In other embodiments, the command may direct the second processor to perform another action or task, or initiate a process such as a web search or a response to a query posed by additional data that will be sent to the second processor.

In some embodiments where the command is a wake-up command sent to the second processor (e.g., host processor 110 or external processor 210), in response to either sensor processor 172 receiving notification that the second processor has exited a low-power mode or sensor processor 172 detecting that the second processor has left the low power mode, sensor processor 172 begins passing a portion of the buffered data to the second processor (e.g., to host processor 110 or its host memory/buffer 130, or to external processor 210 or a memory associated with it). Depending on positioning of a start-end marker 330 (and optionally a data marker 340) this can comprise passing one or more of triggering data 310, data received and buffered some fixed distance before triggering data 310, and data received after triggering data 310.

In some embodiments where the command is a wake-up command sent to the second processor, in response to either sensor processor 172 receiving notification that the second processor has exited a low-power mode or sensor processor 172 detecting that the second processor has left the low power mode, sensor processor 172 decreases a level of compression applied to data buffered into circular data buffer 177-1 if it had been increased at any time contemporaneous with or after buffering of the triggering data 310. FIGS. 3E, 3F, and 3G show examples of compression being decreased after the location of arrow 362, which represents a point at which sensor processor 172 received notification that second processor had exited its low-power mode. In other embodiments, data may not continue to be buffered, but instead it may be passed directly to the second processor (e.g., to host processor 110 or its host memory 130, to external processor 210 or its associated memory, or to some other designated destination).

Figure 4B:
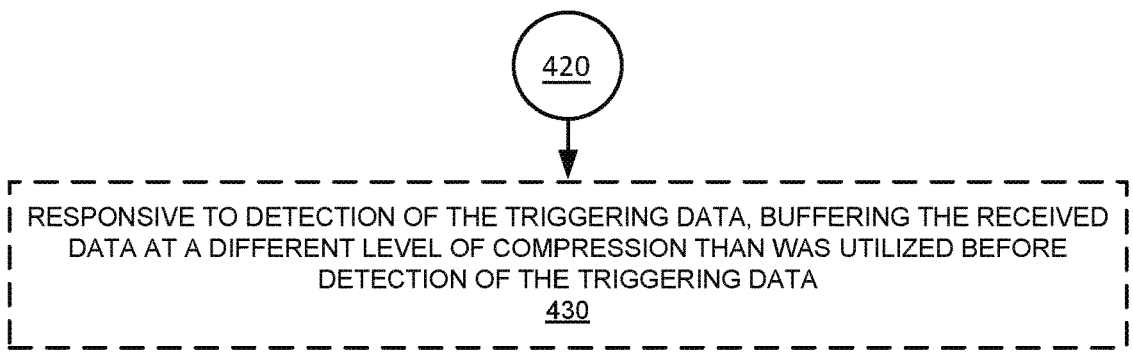

With reference to FIG. 4B, at procedure 430 of flow diagram 400, in various embodiments, the method as described in 410-420 further comprises, in response to detection of the triggering data, buffering the data received after the triggering data at a different level of compression than was utilized before detection of the triggering data. As illustrated in FIGS. 3E, 3F, and 3G, this can comprise sensor processor 172 buffering received data into circular data buffer 177-1 at an increased level of compression as compared to compression level of the data buffered before the triggering data 310.

Figure 4C:
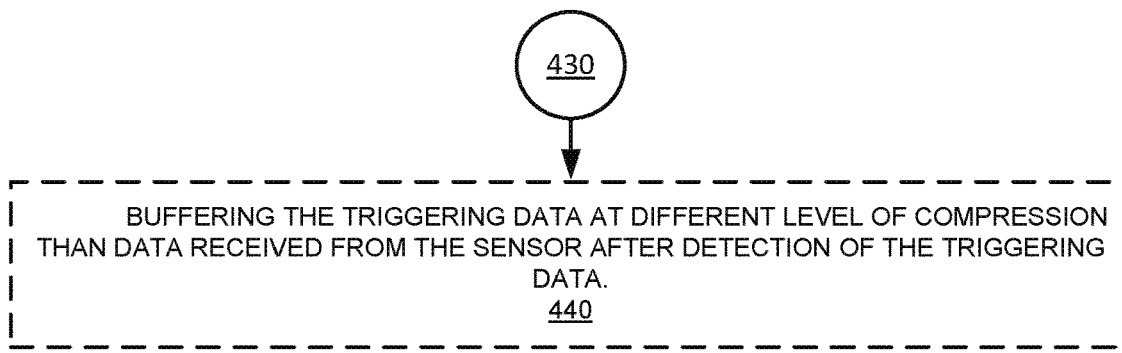

With reference to FIG. 4C, at procedure 440 of flow diagram 400, in various embodiments, the method as described in 410-430 further comprises buffering the triggering data at different level of compression than data received from the sensor after detection of the triggering data. This can comprise sensor processor 172 buffering received data into circular data buffer 177-1 at an increased level of compression as compared to compression level of the triggering data 310. It should be appreciated that, in various embodiments, the triggering data 310 may be more or less compressed than data buffered after triggering data 310.

Figure 4D:
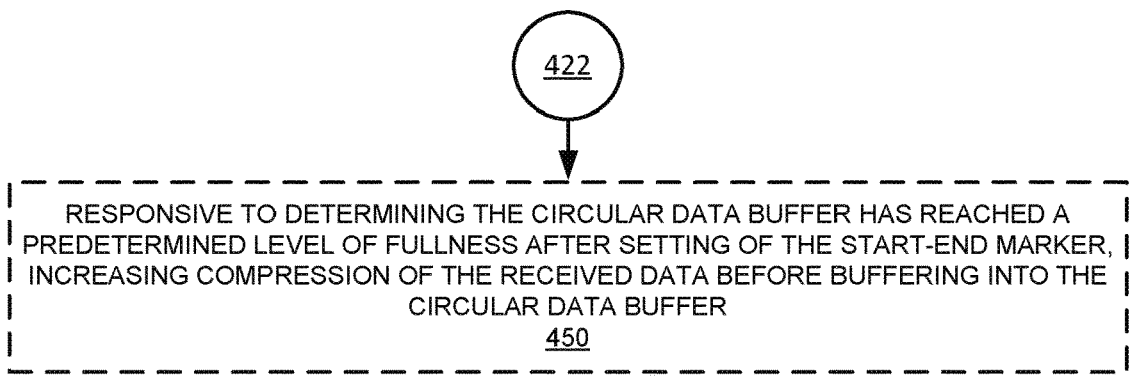

With reference to FIG. 4D, at procedure 450 of flow diagram 400, in various embodiments, the method as described in 410-422 further comprises responsive to determining the circular data buffer has reached a predetermined level of fullness after setting of the start-end marker, after a data marker, or after some other fullness threshold has been satisfied, increasing compression of the received data before buffering into the circular data buffer. In some embodiments, sensor processor monitors the fullness of the circular data buffer 177-1. As illustrated in FIGS. 3F and 3G this can comprise sensor processor 172 buffering received data into circular data buffer 177-1 at an increasing levels of compression as circular data buffer 177-1 becomes increasingly full.

With reference to FIG. 4E, at procedure 460 of flow diagram 400, in various embodiments, the method as described in 410-422 further comprises responsive to determining the circular data buffer has reached a predetermined level of fullness after setting of the start-end marker, replacing data previously buffered into the circular data buffer with a more highly compressed version of the previously buffered data. In some embodiments, sensor processor monitors the fullness of the circular data buffer 177-1. As illustrated in FIG. 3G by dashed line 307, this can comprise sensor processor 172 re-compressing previously buffered data to a higher level of compression in response to a set point of fullness (as indicated by marker 363) being reached in circular data buffer 177-1.

With reference to FIG. 4F, at procedure 470 of flow diagram 400, in various embodiments, the method as described in 410-420 further comprises passing the triggering data from the sensor processor to the second processor for validation by the second processor. This can comprise sensor processor 172 reading the triggering data from circular data buffer 177-1 and passing it to host processor 110 or second processor 210. When triggering data 310 is demarked by a start-end marker 330 and/or one or more data markers 340, this enables sensor processor 172 to quickly identify the specific portion of the buffered data to read and pass for validation.

With reference to FIG. 4G, at procedure 480 of flow diagram 400, in various embodiments, the method as described in 410-420 further comprises setting, by the sensor processor, at least one data marker for identification of specific portions of the buffered data. As depicted in FIGS. 3B and 3C a single data marker 340 can be set by sensor processor 172 to identify portions of the buffered data in circular data buffer 177-1 that correspond to the beginning or end of triggering data 310. As depicted in FIGS. 3B and 3C, data markers 340 may be utilized in conjunction with a start-end marker 330 to bound the start and end of triggering data 310 in circular data buffer 177-1. As depicted in FIG. 3D, a plurality of data markers 340 (e.g., 340-1 and 340-2) can be set by sensor processor 172 to identify portions of the buffered data in circular data buffer 177-1 that correspond to both the beginning and the end of triggering data 310. It should be appreciated that sensor processor 172 may utilize any number of data markers 340 to mark starting points, ending points, regions, or other aspects of portions of the data (e.g., triggering data, command data, context data) in order to provide reference points within or a frame of reference for the data that is being buffered.

SECTION II

Previous discussion in Section I concentrated largely on the operation of a single circular buffer to buffer data, in Section II discussion will move on to the application and integration of multiple buffers.

Figure 5A:
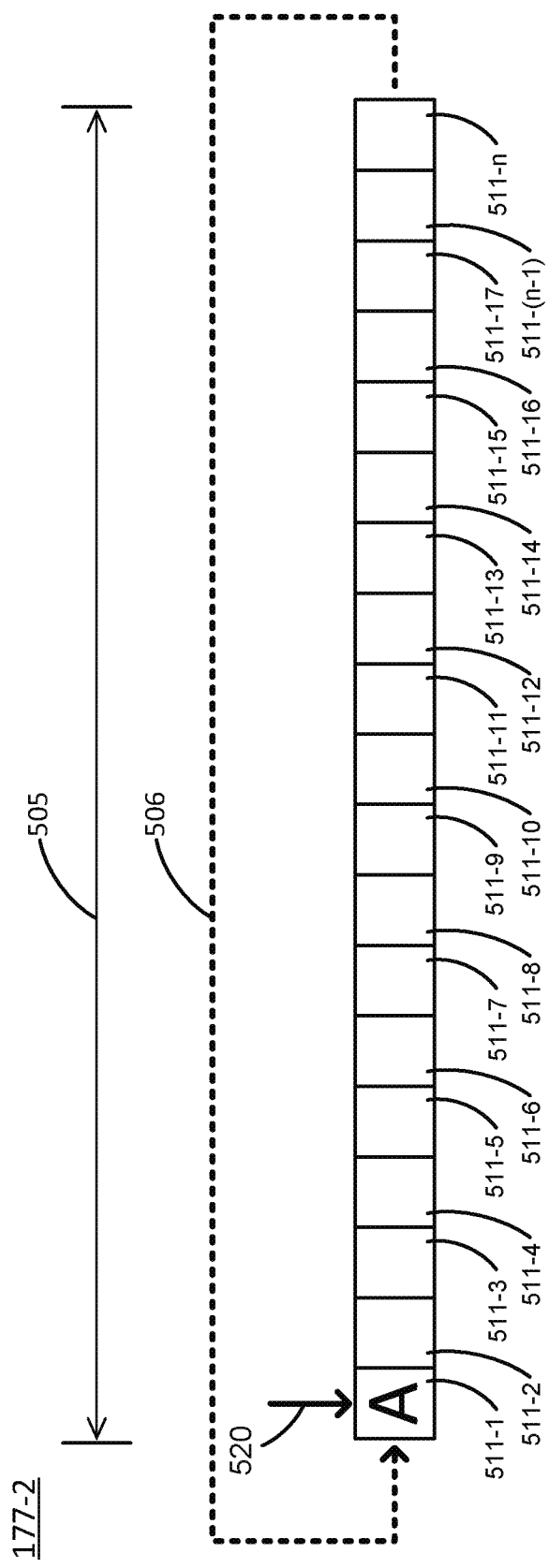
FIG. 5A illustrates a block diagram of a circular data buffer of a sensor processing unit, according to various embodiments.

FIG. 5A illustrates block diagram of a circular data buffer 177-2 of a sensor processing unit 170, according to various embodiments. As has been illustrated in FIGS. 1 and 2, circular data buffer 177-2 may be utilized with or as a portion of a sensor processing unit 170 and/or a mobile electronic device 100. Like circular data buffer 177-1, circular data buffer 177-2 is a data structure that uses a single, fixed-size memory 505 and collection of its ordered memory addresses 511 (511-1, 511-2, 511-3, 511-4, 511-5, 511-6, 511-7, 511-8, 511-9, 511-10, 511-12, 511-13, 511-14, 511-15, 511-16, 511-17 . . . 511-(n−1), and 511-n) as if the ordered memory addresses were connected end-to-end (e.g., 511-n connected back to 511-1 as shown by dashed line 506). In general, circular data buffer 177-2 operates and may be utilized in the manner previously described in conjunction with circular data buffer 177-1. In FIG. 5A, all of memory addresses 511 are blank and unwritten except for address 511-1. Write pointer 520 is shown pointing to address 511-1 and a first portion of data received from a sensor 178 (e.g., sensor 178-3) has been written as represented by the capital letter "A." In this example, as in others herein, it should be appreciated that the data is a binary or other representation of acoustic data and is not actually the letter "A." Likewise, in other examples illustrated and described herein, the capital letters depicted in memory addresses 511 are merely symbolic representations and are not intended to be visual depictions of the actual received data. The size of circular data buffer 177-2 may depend, for example, on the type of sensor, the type of hardware architecture, the type of sensor data, the application the sensor data is intended for, or the power mode of the sensor processing unit 170 or mobile electronic device 100. In one embodiment, circular data buffer 177-2 may be of sufficient size to buffer several seconds (e.g., 3-10 seconds of data received from a sensor 178), before beginning to overwrite itself with newly received data after circling back to the same memory addresses that were previously written with buffered data (as indicated by dashed line 506). In various embodiments, received data from a sensor 178 may be continuously written in a circular fashion into circular data buffer 177-2 in a raw or processed fashion as the data streams in from the sensor. The processing may be done by one or more processors, such as sensor processor 172, host processor 110, or any other available or suited processor.

Figure 5B:
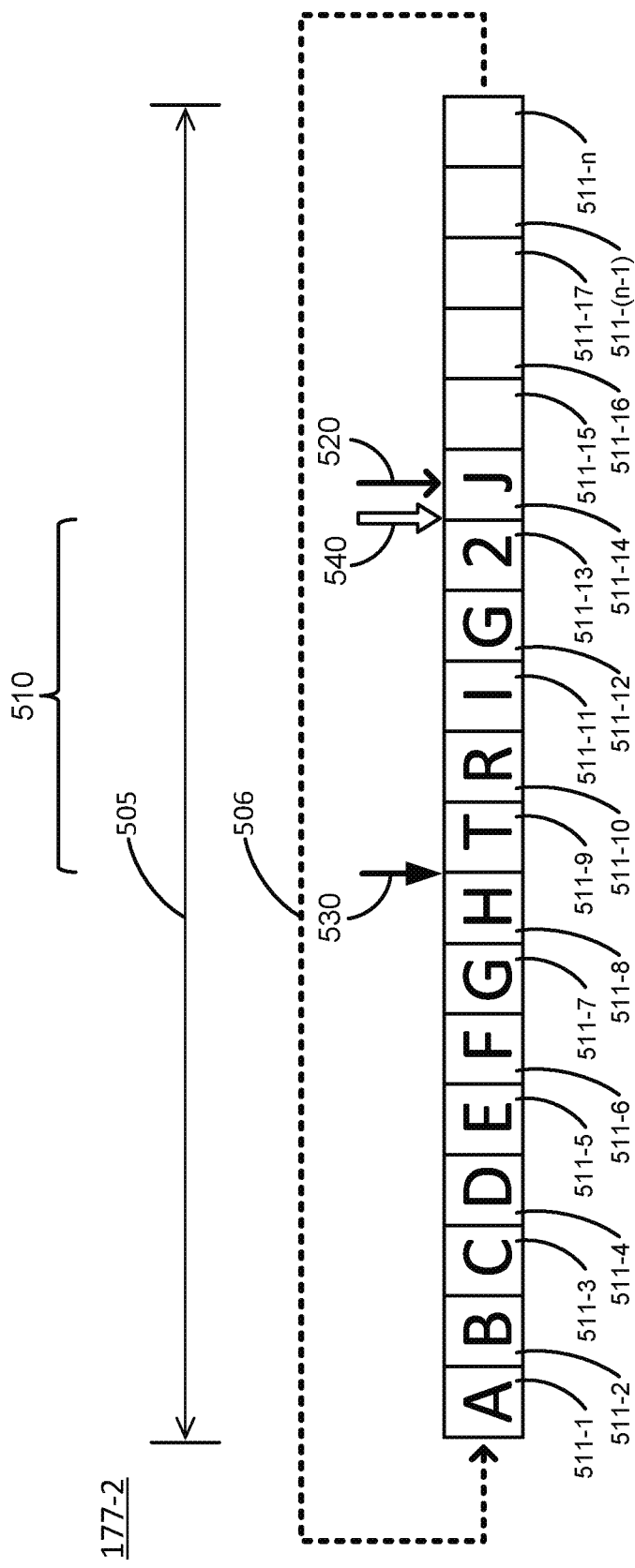
FIG. 5B illustrates example data buffering operations with the circular data buffer of FIG. 3A which take place in response to the sensor processor detecting triggering data, according to various embodiments.

FIG. 5B illustrates example data buffering operations with the circular data buffer 177-2 of FIG. 5A which take place in response to the sensor processor (e.g., 172) detecting triggering data 510, according to various embodiments. In FIG. 5B, write pointer 520 is positioned at memory address 511-14, and memory addresses 511-1 to 511-14 have been sequentially written with received data. In an example where received data is being received from an acoustic sensor 178, sensor processor 172 has detected triggering data 510, such as via speech recognition, in memory addresses 511-9 to 511-13 (indicated as 'TRIG2'). In response to detecting of the triggering data 510 within the received data, sensor processor 172 has set a start-end marker 530. Setting start-end marker 530 marks the beginning of the buffer content that is retained and may be used for the next stage, such as being passed to a second processor. The 'T' in buffer address 511-9 represents the new beginning of circular data buffer 177-2. The 'H' in buffer address 511-8 represents the new end of circular data buffer 177-2 (before starting to overwrite). In various embodiments, the second processor may be a host processor 110 of mobile device 100, an external processor 210 in a datacenter (e.g., in the "cloud"), or an external processor 210 in an electronic device that is separate from mobile device 100). Start-end marker 530 also marks a circular end of circular data buffer 177-2, as an address that should not be overwritten until the received data buffered in it can be transmitted elsewhere and/or until it can be confirmed that an action has taken place such as waking up a host processor. As will be further discussed, various adaptive buffering techniques may be implemented to prevent unintentional overwriting of the starting memory address marked by the start-end marker 530.

As depicted in FIG. 5B, sensor processor 172 has placed start-end marker 530 at the beginning of the triggering data 510. Start-end marker 530 may be positioned in places other than at the beginning of triggering data 510, in other embodiments. FIG. 3C and FIG. 3D, described above, show some examples other positions that a start-end marker may be placed by sensor processor 172.

In some embodiments, sensor processor 172 may additionally set one or more data markers 540 to mark or point to various portions of data of interest. In FIG. 5B, data marker 540 has been positioned at the end of triggering data 510. In this fashion, start-end marker 530 marks the beginning (memory address 511-9) and data marker 540 marks the end (memory address 511-13) of the range of received data that comprises the triggering data 510. In some embodiments, one or more data markers 540 may be used to identify or indicate specific section of a speech, words, or command that follows the triggering data 510. In some embodiments, one or more data markers 540 may be used to identify the presence or absence of relevant or irrelevant data, such as e.g., pauses in speech. In some embodiments, triggering data 510 and/or a command, or sections of commands, are transmitted elsewhere to a second processor for reprocessing and/or validation and these markings denote which portion of the buffered received data should be sent. By setting start-end marker 530 at the beginning of the triggering data 510, buffering can be adapted to preserve the triggering data 510 and prevent it from being unintentionally overwritten.

Figure 6A:
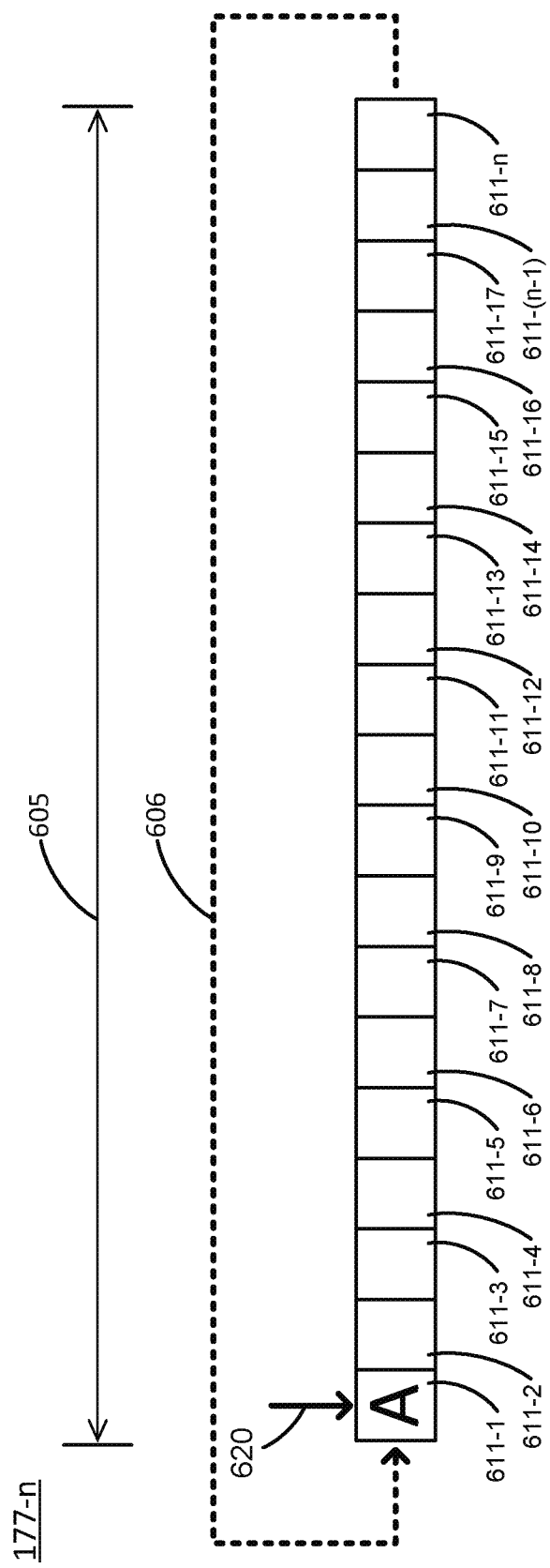
FIG. 6A illustrates block diagram of a circular data buffer of a sensor processing unit, according to various embodiments.

FIG. 6A illustrates block diagram of a circular data buffer 177-$n$ of a sensor processing unit 170, according to various embodiments. As has been illustrated in FIGS. 1 and 2, circular data buffer 177-$n$ may be utilized with or as a portion of a sensor processing unit 170 and/or a mobile electronic device 100. Like circular data buffers 177-1 and 177-2, circular data buffer 177-$n$ is a data structure that uses a single, fixed-size memory 605 and collection of its ordered memory addresses 611 (611-1, 611-2, 611-3, 611-4, 611-5, 611-6, 611-7, 611-8, 611-9, 611-10, 611-12, 611-13, 611-14, 611-15, 611-16, 611-17 . . . 611-($n$–1), and 611-$n$) as if the ordered memory addresses were connected end-to-end (e.g., 611-$n$ connected back to 611-1 as shown by dashed line 606). In general, circular data buffer 177-$n$ operates and may be utilized in the manner previously described in conjunction with circular data buffer 177-1 or 177-2. In FIG. 6A, all of memory addresses 611 are blank and unwritten except for address 611-1. Write pointer 620 is shown pointing to address 611-1 and a first portion of data received from a sensor 178 (e.g., acoustic sensor 178-2) has been written as represented by the capital letter "A." In this example, as in other examples herein, it should be appreciated that the data is a binary or other representation of acoustic data and is not actually the letter "A." Likewise, in other examples illustrated and described herein, the capital letters depicted in memory addresses 611 are merely symbolic representations and are not intended to be visual depictions of the actual received data. The size of circular data buffer 177-$n$ may depend, for example, on the type of sensor, the type of sensor data, the application the sensor data is intended for, or the power mode of the sensor processing unit 170 or mobile electronic device 100. In one embodiment, circular data buffer 177-$n$ may be of sufficient size to buffer several seconds (e.g., 3-10 seconds of data received from a sensor 178), before beginning to overwrite itself with newly received data after circling back to the same memory addresses that were previously written with buffered data. In various embodiments, received data from a sensor 178 may be continuously written in a circular fashion into circular data buffer 177-$n$ in a raw or processed fashion as the data streams in from the sensor.

Figure 6B:
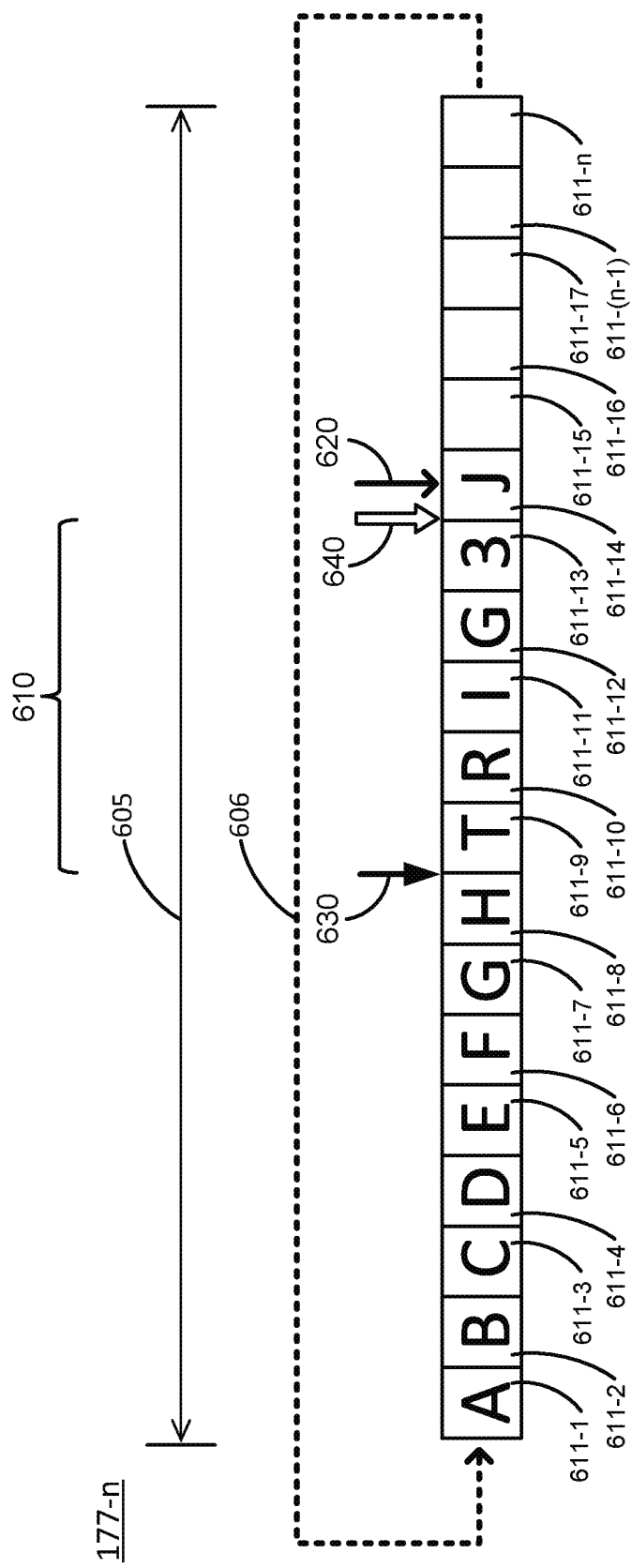
FIG. 6B illustrates example data buffering operations with the circular data buffer of FIG. 6A which take place in response to the sensor processor detecting triggering data, according to various embodiments.

FIG. 6B illustrates example data buffering operations with the circular data buffer 177-$n$ of FIG. 6A which take place in response to the sensor processor (e.g., 172) detecting triggering data 610, according to various embodiments. In FIG. 6B, write pointer 620 is positioned at memory address 611-14, and memory addresses 611-1 to 611-14 have been sequentially written with received data. In an example where received data is being received from a motion sensor 178, sensor processor 172 has detected triggering data 610 in memory addresses 611-9 to 611-13 (indicated as 'TRIG3'). When sensor 178 is a motion sensor, the triggering data 610 may be a certain motion threshold in the motion data. The motion threshold can be a threshold amplitude of motion that when met can be used as a threshold. The motion threshold can also be an acceleration of motion threshold or a velocity of motion threshold (e.g., a translation or rotation velocity). The threshold may also correspond to other motion characteristics, such as the frequency of motion, wherein the triggering data 610 may be a motion frequency threshold. In some embodiments, the triggering data may be the occurrence of some kind of predefined motion pattern or predefined motion gesture—collectively referred to as a pattern of motion. These patterns or gestures may be based on a predefined sequence of raw data or processed data that is stored and against which motion data is compared. To detect these patterns or gesture, standard gesture recognition techniques may be applied, such as e.g., Dynamic Time Warping (DTW). The motion data used in the circular buffer may also represent orientation data, for example the orientation of the device in a reference frame (e.g., the world reference frame). The orientation data may be based on a single motion sensor, such as an accelerometer, or a fusion process of several motion sensors, such as a fusion of accelerometer data and gyroscope and/or magnetometer data. Any of the processing of the motion data and detection of the triggering data may be done by sensor processor 172, especially in a low-power mode of device 100 where the host processor 110 may be asleep and unavailable. In response to detecting of the triggering data 610 within the received data, sensor processor 172 has set a start-end marker 630. Setting start-end marker 630 marks the beginning of the buffer content that is retained and used for the next stage, such as being passed to a second processor. The 'T' in buffer address 611-9 represents the new beginning of circular data buffer 177-$n$. The 'H' in buffer address 611-8 represents the new end of circular data buffer 177-$n$ (before starting to overwrite). In various embodiments, the second processor may be a host processor 110 of mobile device 100, an external processor 210 in a datacenter (e.g., in the "cloud"), or an external processor 210 in an electronic device that is separate from mobile device 100). Start-end marker 630 also marks a circular end of circular data buffer 177-$n$, as an address that should not be overwritten until the received data buffered in it can be transmitted elsewhere and/or until it can be confirmed that an action has taken place such as waking up a host processor. As will be further discussed, various adaptive buffering techniques may be implemented to prevent unintentional overwriting of the starting memory address marked by the start-end marker 630.

As depicted in FIG. 6B, sensor processor 172 has placed start-end marker 630 at the beginning of the triggering data 610. Start-end marker 630 may be positioned in places other than at the beginning of triggering data 610, in other embodiments. FIG. 3C and FIG. 3D, described above, show some examples other positions that a start-end marker may be placed by sensor processor 172.

In some embodiments, sensor processor 172 may additionally set one or more data markers 640 to mark or point to various portions of data of interest. In FIG. 6B, data marker 640 has been positioned at the end of triggering data 610. In this fashion, start-end marker 630 marks the beginning (memory address 611-9) and data marker 640 marks the end (memory address 611-13) of the range of received data that comprises the triggering data 610. In some embodiments, one or more data markers 640 may be used to identify or indicate specific section of a command that follows the triggering data 610. In some embodiments where motion sensors are used, one or more data markers 540 may be used to identify certain motion (sub) patterns. In some embodiments where motion sensors are used, one or more data markers 540 may be used to identify the presence or absence of relevant or irrelevant data, such as e.g., no or little motion below a threshold. In some embodiments, triggering data 610 and/or a command, or sections of commands, are transmitted elsewhere to a second processor for reprocessing and/or validation and these markings denote which portion of the buffered received data should be sent. By setting start-end marker 630 at the beginning of the triggering data 610, buffering can be adapted to preserve the triggering data 610 and prevent it from being unintentionally overwritten.

Figure 7:
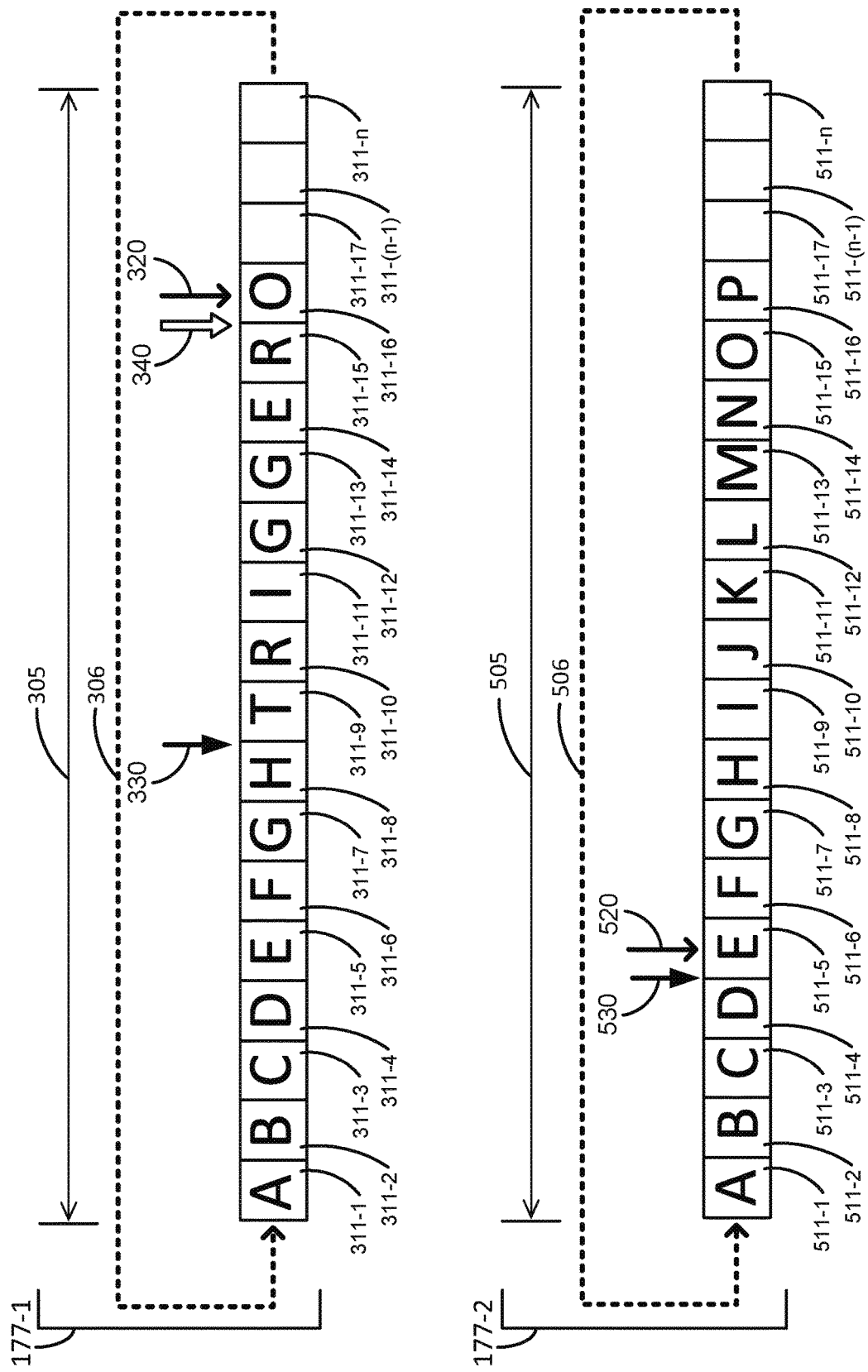
FIG. 7 illustrates an example of start-end markers being set in two separate circular data buffers, according to various embodiments.

FIG. 7, illustrates start-end markers being set in two separate circular data buffers 177 (177-1, 177-2). In various embodiments, the start-end markers (330, 530) in the different circular data buffers 177-1, 177-2 may be at the same position, or may be at different positions. For example, the start-end marker may be set at the start of the triggering data in a first circular data buffer that buffers audio data, and may be set at a predefined distance (or time equivalent) before the triggering data in a second, different circular data buffer that stores motion data. Similar strategies may be applied when using more than two circular data buffers.

Example Methods of Operation

Figure 8B:
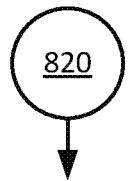

FIGS. 8A and 8B illustrate a flow diagram 800 of an example method of adaptive buffering in a mobile device having a host processor and a sensor processor coupled with the host processor, according to various embodiments. Procedures of this method will be described with reference to elements and/or components of one or more of FIG. 1, FIG. 2, FIGS. 3A-3G, and FIGS. 5A-6B. It is appreciated that in some embodiments, the procedures may be performed in a different order than described, that some of the described procedures may not be performed, and/or that one or more additional procedures to those described may be performed. Flow diagram 800 includes some procedures that, in various embodiments, are carried out by one or more processors under the control of computer-readable and computer-executable instructions that are stored on non-transitory computer-readable storage media (e.g., memory 176). It is further appreciated that one or more procedures described in flow diagram 800 may be implemented in hardware, or a combination of hardware with firmware and/or software.

With reference to FIG. 8A, at procedure 810 of flow diagram 800, in various embodiments, a sensor processor is used to buffer data received from a sensor that is operated by the sensor processor. The data is buffered by the sensor processor into a circular data buffer. In various embodiments, this comprises sensor processor 172 receiving data from one or more sensors 178 (e.g., sensor 178-1, 178-2, 178-2, 178-n) and then buffering the received data into one or more circular data buffers 177 (177-1, 177-2, 177-n).

With continued reference to FIG. 8A, at procedure 820 of flow diagram 800, in various embodiments, responsive to the sensor processor detecting triggering data within the received data the procedures described 822, 824, and 826 are carried out. In various embodiments, this comprises sensor processor 172 detecting for triggering data (e.g., triggering data 310, or the like) in the form of a keyword/phrase in an audio data stream from an audio sensor 178 (for example, sensor 178-2 by an audio sensor in some embodiments), and/or a predefined pattern of motion or event in a motion data stream from a motion sensor 178 (for example, sensor 178-3 may be a motion sensor in some embodiments), and/or a predefined visual event in a visual data stream from an image sensor 178 (for example, sensor 178-n may be an image sensor in some embodiments). Responsive to detection of triggering data 310, sensor processor 172 carries out other procedures, such as the procedures described in 822, 824, and 826 of FIG. 8A.

With continued reference to FIG. 8A, at procedure 822 of flow diagram 800, in various embodiments, a first adaptive data buffering action is initiated with respect to the data received from the sensor operated by the sensor processor. In some embodiments this comprises a first start-end marker being set in the circular data buffer by the sensor processor. In various embodiments, this comprises sensor processor 172 setting a start-end marker (e.g., 330, 530, 630, etc.) in a circular data buffer 177 (e.g., circular data buffer 177-1). The start-end marker can be set at various positions depending on, for example, the capabilities of sensor processor 172 to process triggering data (e.g., 310, 510, 610) with/without validation and whether additional context data is being preserved for further processing apart from sensor processor 172. As is illustrated in FIG. 3B (and similarly in FIGS. 5B and 6B), in some embodiments sensor processor 172 sets the start-end marker at the beginning of triggering data. As is illustrated in FIG. 3C, in some embodiments sensor processor 172 sets the start-end marker at the end of triggering data (e.g., 310). As is illustrated in FIG. 3D, in some embodiments sensor processor 172 sets the start-end marker at some predetermined distance (the distance may be measured in memory addresses or time as related to buffering speed) in advance of the beginning of triggering data (e.g., 310) in order to capture context from received data buffered just before detection of triggering data.

In some embodiments, as after setting a first start-end marker (e.g., 330 in circular data buffer 177-1) sensor processor 172 sets a second start-end marker (e.g., 520 in circular data buffer 177-2) in a second circular data buffer that is also used to buffer. In some embodiments, the second circular data buffer may be used to buffer a portion of the received data (e.g., data that is considered noise data but may be saved for further analysis). In some embodiments, the second circular data buffer may be used to store data from a second sensor, different sensor than the first sensor. The first and second sensor may be of different types, such as e.g., an audio sensor and a motion sensor. Either or both of the first and second sensor may be located in sensor processing unit 170, external to sensor processing unit 170 (e.g., like sensor 178-2), but within mobile electronic device 100 (e.g., like sensor 178-1), or external to but communicatively coupled with mobile electronic device 100. This is depicted in FIG. 7, which illustrates start-end markers being set in two separate circular data buffers 177 (177-1, 177-2). The start-end markers (330, 530) in the different circular data buffers may be at the same position, or may be at different positions. For example, the start-end marker may be set at the start of the triggering data in a first circular data buffer, and may be set at a predefined distance (or time equivalent) before or after the triggering data in a second, different circular data buffer.

In some embodiments, the first adaptive buffering action comprises: responsive to detection of the triggering data, buffering the received data at a different level of compression than was utilized before detection of the triggering data. This variance in the level of compression is described in detail in FIG. 3C and in 440 of FIG. 4 and would be carried out in substantially the same manner.

In some embodiments, the first adaptive buffering action comprises: responsive to the data buffer in which the received data is buffered reaching a predetermined level of fullness, increasing compression of the data before buffering into the data buffer. This variance in the compression is described at least in FIG. 4D and 450 of FIG. 4 and would be carried out in substantially the same manner. If multiple circular data buffers are used, the compression (change) settings may be different for each buffer and may depend e.g., on the type of sensor or type of data a particular one of the circular data buffers is being utilized with.

With continued reference to FIG. 8A, at procedure 824 of flow diagram 800, in various embodiments, the sensor processor initiates a second adaptive data buffering action with respect to second data received from a second sensor of the mobile device. For example, the second data is buffered into a second circular data buffer that is different from the first circular data buffer and may be located in the same or in a separate memory from the memory in which the first circular data buffer is located. In some embodiments this comprises a second start-end marker being set in the second circular data buffer by the sensor processor. In various embodiments, this comprises sensor processor 172 setting a second start-end marker (e.g., 330, 530, 630, etc.) in a second circular data buffer 177 (e.g., circular data buffer 177-n) that is different from the first circular data buffer. The second start-end marker can be set at various positions depending on, for example, the capabilities of sensor processor 172 to process triggering data (e.g., 310, 510, 610) with/without validation and whether additional context data is being preserved for further processing apart from sensor processor 172. As is illustrated in FIG. 3B (and similarly in FIGS. 5B and 6B), in some embodiments sensor processor 172 sets the second start-end marker at the beginning of triggering data. As is illustrated in FIG. 3C, in some embodiments sensor processor 172 sets the second start-end marker at the end of triggering data (e.g., 310). As is illustrated in FIG. 3D, in some embodiments sensor processor 172 sets the second start-end marker at some predetermined distance (the distance may be measured in memory addresses or time as related to buffering speed) in advance of the beginning of triggering data (e.g., 310) in order to capture context from received data buffered just before detection of triggering data.

In some embodiments, the first sensor and the second sensor are like types of sensors (e.g., both are acoustic sensors (microphones), both are motion sensors (accelerometers, gyroscopes, magnetometers), etc.) and the initiating of the second adaptive data buffering action with respect to second data received from the second sensor of the mobile device comprises combining or otherwise mixing the received data and the second received data. The combined data may then be stored in a single circular data buffer (e.g., 177-1) or the data may be stored in two separate circular data buffers (e.g., 171-1 and 171-2). This combining can comprise any type of combining including but not limited to: merging of the two data streams (e.g., adding them together, subtracting them, heterodyning them, forming an audio beam data stream from two or more audio from at least two acoustic sensors); and storing data from the two data streams 1 and 2 in any interspersed fashion (e.g., 1/2/1/2 . . . ). With respect to audio data, many techniques are well-known in the art for mixing data from two or more microphones into a single data stream such as an audio beam.

When buffering data from a plurality of acoustic sensors 178, such as e.g., microphones, the data from each microphone may be stored a separate circular buffer 177. In such an embodiment, for each microphone, a corresponding circular data buffer 177 is required. The compression may be identical for all buffers 177, or for each buffer 177 the compression may be adapted, for example to the e.g., quality of the audio stream and/or specification of the microphone or microphone settings. For example, if an audio stream has lower quality, e.g., due to a larger distance from the source, that corresponding buffer 177 may be less compressed because that would decrease quality. The sensor processor 172 may perform some form of signal analysis on the data in order to determine the best buffer and compression settings. The memory addresses of a plurality of buffers 177 may be adjusted so that even if there are different compression settings among the plurality of buffers, the markers correspond to the same point in time.

The audio data from the different microphones may also be combined into audio beams, which may be focused on one or more audio sources. Audio beamforming is well known in the conventional art, and will therefore not be elaborated on here. If there are multiple microphones but only one audio source, the audio stream may be combined into one beam corresponding to the one audio source. In this case, even though there are several microphones (e.g., several sensors 178), only one audio stream may be buffered. The original audio data from the different microphones may be stored in additional buffers which may or may not be circular data buffers, and which may be done at a different compression rate from the compression rate used for the audio stream that corresponds to the formed beam. If more than one audio source is present, a plurality of audio data streams/beams may be formed, each focusing on one of the audio sources. In this case, each audio data stream corresponding to an audio source may be buffered in a circular buffer 177. The sensor processor 172 may determine some characteristics of the audio sources, and depending on the results, adapt the buffering using techniques described herein. Some audio source(s) may not be buffered, for example, if it is determined that it/they are sources of noise. The sensor processor 172 may determine if the audio is coming from a person speaking, or from a playback device (e.g., television, computer, audio player), and may adapt the buffering differently. The sensor processor 172 may perform some form of audio classification of the source (e.g., 'human speech', 'playback', 'noise') and for each class apply different buffering settings. For example, 'human speech' may be buffered with different compression settings than 'playback'. The results of the classification may be stored with the data in the circular buffer 177 into which the data is being buffered.

The sensor processor 172 does not necessarily have to look for the triggering data in each buffer. For example, in the example above where one source/buffer 177 may be 'human speech' and another source/buffer 177 may be 'playback', the sensor processor 172 may only look for triggering data in the 'human speech' buffer if the sensor processor is looking for spoken word commands from the user. Whether or not to look for triggering data may depend on the results of the classification. The 'playback' audio stream may still be buffered, for example, to facilitate current/later determination from audio analysis which song, music, or multi-media piece is playing, but no triggering data search is needed. In some embodiments, the sensor processor 172 may only buffer the 'playback' audio stream until it has determined which song, music, or multi-media piece it is, and then stop or adapt the buffering until another song, music piece, or multi-media piece is started.

The number of active buffers 177 may be constant or predefined, or may be adapted to the situation. For example, if multiple microphones can detect multiple audio streams, the amount of streams may vary and the number of active buffers 177 may be adapted to the number of active audio streams. More in general, the amount of active buffers 177 maybe adapted to be equal to the number of active sensors, of the same or different type. In some embodiments, the amount of available memory is limited and may not allow for the creation of multiple buffers 177 with an initially predefined size. For example, a fixed memory size must be shared and used to create the overall number of required buffers 177, and in such embodiments the buffer size (i.e., the portion of memory assigned to a particular buffer) and compression settings are adapted to make the required amount of buffers 177 fit in the available memory.

In embodiments where data from a plurality of motion sensors is buffered, some similar strategies to the previously discussed audio buffering strategies may be applied. Each motion sensor data may be buffered in a corresponding buffer 177, or the data from the different sensors may be combined and buffered into a single buffer 177. For example, in an accelerometer sensor with 3 axes, the raw acceleration data from the 3 axes may be stored in separate buffers, or the data may first be processed and then stored, which may require less buffers and less overall memory. Data from different motion sensors may also be combined in a data fusion operation, with the fused data stored in a single circular buffer 177. For example, data from an accelerometer maybe combined with data from a gyroscope and/or data from a magnetometer, and as a result of the fusion, an orientation of the device is determined. This fused orientation data may then be stored in a single circular buffer 177, where the amount of buffering space required in the single circular data buffer 177 may depend on the degrees of freedom represented in the fused orientation data, the data rate, and the length of time over which the data is expected to be stored before being overwritten.

In some embodiments, a plurality of circular buffers may 177 be used to buffer data from different sensors. For example, a first circular buffer 177 may buffer data from a microphone and a second circular buffer 177 may buffer data from a motion sensor at the same time. The sensor processor 172 may look for triggering data in data stored in the first circular buffer 177, such as e.g., a keyword, and when the triggering data is detected may set start-end markers (or other markers) in one or both buffers. In some embodiments, the data markers in the two buffers, the start-end markers in the two data buffers, or both may be set at identical times, both corresponding with the time of the triggering data. In some embodiments, the times of the data markers in the two buffers, the times of the start-end markers in the two buffers, or both may be set at differing times from one another. For example, when triggering data is detected in the audio buffer, a start-end marker may be set at the start of the triggering data in the audio buffer, but the start-end marker in the motion buffer may be set at a location that corresponds to some predefined amount of time before the time of the triggering data. As a result, a larger history of motion data will be available. This may help to provide more motion data for the data analysis. For example, a user may use some sort of transportation and ask the device when he or she arrives. The motion data history may be used to analyze and determine the type of transportation (e.g., train, automobile, aircraft, etc.), and provide a more accurate answer with a faster response due to the already stored motion data.

In some embodiments, the first buffering action 822 and the second buffering action 824 may be done sequentially. In some embodiments, a second buffering action 824 may be triggered by the first buffering action 822. For example, in an application of using an audio sensor for keyword detection, the keyword detection may comprise different levels, where the different levels may correspond to different power and resource requirements. The first buffering action 822 may look for an audio signal (e.g., human speech, or music) above a certain threshold. The triggering data may then correspond to a certain audio level for a certain amount of time (e.g., of the order of a second). The triggering data may then be detected by a simple algorithm (implemented in hardware or software) which requires few computing resources, and the first circular buffer may be quite small. The detection of the triggering data may initiate the second buffering action 824, which may be configured to look for an actual keyword. The second buffering action 824 may use a different circular buffer, may use the same circular buffer, or may change the size of the first circular buffer. Consider an example where the same buffer is used. In such an example, the initial data may stay in the buffer, but the buffer size may be expanded to allow for the detection of the keywords (e.g., second trigger), which in most cases has a longer duration than initial triggering data that is only based on audio level detection. For the detection of the second trigger, the initial start-end marker of the first trigger may be used, because this corresponds to the start of the increase audio level, which may also correspond to the start of the keyword. The detection of the first triggering data may be done in hardware using an audio level detector. This means that the required action from the sensor processor 172 may be kept to a minimum. For the detection of the second triggering data, i.e., the keyword, the sensor processor 172 may be used to run a keyword detection algorithm. In some embodiments, the second adaptive buffering action comprises: responsive to detection of the triggering data, buffering the second data at a different level of compression than was utilized before detection of the triggering data. This variance in the level of compression is described in detail in FIG. 3C and in 440 of FIG. 4 and would be carried out in substantially the same manner.

In some embodiments, the second adaptive buffering action comprises: responsive to a second data buffer in which the received second data is buffered reaching a predetermined level of fullness, increasing compression of the second data before buffering into the second data buffer. This variance in the compression is described at least in FIG. 4D and 450 of FIG. 4 and would be carried out in substantially the same manner.

With continued reference to FIG. 8A, at procedure 826 of flow diagram 800, in various embodiments, the sensor processor sends a command from the sensor processor to a second processor. In various embodiments, this comprises sensor processor 172 sending the command to the second processor which may be host processor 110 and/or a processor 210 that is external to mobile electronic device 100. It should be appreciated that external processor 210 may be located in another mobile electronic device, in a stand-alone computer system, in a datacenter (e.g., in a "cloud" of Internet connected shared on demand computing resources), etc. In some embodiments, the triggering data may be packaged with or otherwise sent to the second processor along with or as part of the command.

In some embodiments, the command may be a wake-up command that causes the second processor to exit a low-power mode in which it conserves power but has fewer processing capabilities and enter a higher power mode, such as a full-power mode, which consumes more power but allows the second processor to perform more processing tasks. In other embodiments, the command may direct the second processor to perform another action or task, or initiate a process such as a web search or a response to a query posed by additional data that will be sent to the second processor.

In some embodiments where the command is a wake-up command sent to the second processor (e.g., host processor 110 or external processor 210), in response to either sensor processor 172 receiving notification that the second processor has exited a low-power mode or sensor processor 172 detecting that the second processor has left the low power mode, sensor processor 172 begins passing a portion of the buffered data to the second processor (e.g., to host processor 110 or its host memory/buffer 130, or to external processor 210 or a memory associated with it). Depending on positioning of a start-end marker (and optionally a data marker) this can comprise passing one or more of triggering data, data received and buffered some fixed distance before triggering data, and data received after triggering data.

In some embodiments where the command is a wake-up command sent to the second processor, in response to either sensor processor 172 receiving notification that the second processor has exited a low-power mode or sensor processor 172 detecting that the second processor has left the low power mode, sensor processor 172 decreases a level of compression applied to data buffered into circular data buffer 177 if it had been increased at any time contemporaneous with or after buffering of the triggering data 310. FIGS. 3E, 3F, and 3G show examples of compression being decreased after the location of arrow 362, which represents a point at which sensor processor 172 received notification that second processor had exited its low-power mode. In other embodiments, after sending the command data may not continue to be buffered, but instead it may be passed directly to the second processor (e.g., to host processor 110 or its host memory 130, to external processor 210 or its associated memory, or to some other designated destination).

With reference to FIG. 8B, at procedure 830 of flow diagram 800, in various embodiments, the method as described in 810-820 further comprises, responsive to the sensor processor detecting second triggering data, initiating a third adaptive data buffering action with respect to third data received from a third sensor. In one example, when the first triggering data is acoustic data exceeding an audio threshold the second triggering data could be the receipt of a keyword (i.e., detected with speech recognition) in either the received data or the second received data. In another example, when the first triggering data is a keyword, the second triggering data may comprise sensing motion that exceeds a frequency or amplitude threshold. In some embodiments, the third adaptive data buffering action may comprise setting a start-end marker in a third circular data buffer (e.g., 177-*n*) that is different from the circular data buffer (e.g., 177-1) and the second circular data buffer (e.g., 177-2).

CONCLUSION

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. Many aspect of the different example embodiments that are described above can be combined into new embodiments. The description as set forth is not intended to be exhaustive or to limit the embodiments to the precise form disclosed. Rather, the specific features and acts described above are disclosed as example forms of implementing the claims.

Reference throughout this document to "one embodiment," "certain embodiments," "an embodiment," "various embodiments," "some embodiments," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics of any embodiment may be combined in any suitable manner with one or more other features, structures, or characteristics of one or more other embodiments without limitation.

What is claimed is:

1. A method of adaptive buffering in a mobile device having a sensor processor, said method comprising:
using said sensor processor to buffer data received from a sensor that is operated by said sensor processor, wherein said data is buffered by said sensor processor into a circular data buffer; and
responsive to said sensor processor detecting triggering data within said data:
setting, by said sensor processor, a start-end marker relative to said triggering data in said circular data buffer, wherein said start-end marker delays overwriting at least a portion of said data following said start-end marker until completion of an action; and
sending a command from said sensor processor to a second processor.

2. The method as recited in claim 1, wherein said setting, by said sensor processor, said start-end marker relative to said triggering data in said circular data buffer comprises:
setting said start-end marker at an end of said triggering data.

3. The method as recited in claim 1, wherein said setting, by said sensor processor, said start-end marker relative to said triggering data in said circular data buffer comprises:
setting said start-end marker at a beginning of said triggering data.

4. The method as recited in claim 1, wherein said setting, by said sensor processor, said start-end marker relative to said triggering data in said circular data buffer comprises:
setting said start-end marker a predetermined distance in advance of a beginning of said triggering data.

5. The method as recited in claim 1, wherein said command follows said triggering data within the data.

6. The method as recited in claim 1, further comprising:
setting, by said sensor processor, at least one data marker for identification of specific portions of said data.

7. The method as recited in claim 1, further comprising:
responsive to detection of said triggering data, buffering said data at a different level of compression than was utilized before detection of said triggering data.

8. The method as recited in claim 7, further comprising:
buffering said triggering data at a different level of compression than other data of said data received from said sensor after detection of said triggering data.

9. The method as recited in claim 1, further comprising:
responsive to said circular data buffer reaching a predetermined level of fullness, increasing compression of said data before buffering into said circular data buffer.

10. The method as recited in claim 1, further comprising:
responsive to said circular data buffer reaching a predetermined level of fullness, replacing said data previously buffered into said circular data buffer with a more highly compressed version of said data.

11. The method as recited in claim 1, further comprising:
passing said triggering data from said sensor processor to said second processor for validation by said second processor.

12. The method as recited in claim 1, wherein a processor of said mobile device is in a low-power mode, and wherein said sending said command from said sensor processor to said second processor of said mobile device comprises:
sending a wake-up command from said sensor processor to said second processor.

13. The method as recited in claim 12, further comprising:
responsive to said second processor exiting said low-power mode, passing a portion of said buffered data to said second processor.

14. A method of adaptive buffering in a mobile device having sensor processor, said method comprising:
using said sensor processor to buffer first data received from first sensor that is operated by said sensor processor, wherein said first data is buffered by said sensor processor into a first circular data buffer;
using said sensor processor to buffer second data received from a second sensor that is operated by said sensor processor, wherein said second data is buffered by said sensor processor into a second circular data buffer; and
responsive to said sensor processor detecting triggering data within said first data:
setting, by said sensor processor, a first start-end marker relative to said triggering data in said first circular data buffer, wherein said first start-end marker delays overwriting at least a portion of said first data following said first start-end marker until completion of a first action; and
setting, by said sensor processor, a second start-end marker relative to said triggering data in said second circular data buffer, wherein said second start-end marker delays overwriting at least a portion of said second data following said second start-end marker until completion of a second action; and
sending a command from said sensor processor to a second processor.

15. The method as recited in claim 14, wherein said first start-end marker is set in said first circular data buffer at a same position as said second start-end marker is set in said second circular data buffer.

16. The method as recited in claim 14, wherein said first start-end marker is set in said first circular data buffer at a different position as said second start-end marker is set in said second circular data buffer.

17. The method as recited in claim 16, wherein said second start-end marker is set in said second data circular buffer a predetermined distance from said first start-end marker in said first circular data buffer.

18. A sensor processing unit comprising:
a circular data buffer;
a sensor; and
a sensor processor configured to:
operate said sensor;
buffer data received from said sensor into said circular data buffer;
detect for triggering data within said data received from said sensor; and
responsive to detection of said triggering data within said data:
set a start-end marker relative to said triggering data in said circular data buffer, wherein said start-end marker delays overwriting at least a portion of said data following said start-end marker until completion of an action; and
send a command from said sensor processor to a second processor.

19. The sensor processing unit of claim 18, wherein said command comprises:
a wake-up command for said second processor, said wake-up command configured to cause said second processor to exit from a low-power mode.

20. The sensor processing unit of claim 19, wherein said sensor processor is further configured to:
pass a portion of said data to said second processor in response to said second processor exiting said low-power mode.

* * * * *